US012463084B2

(12) United States Patent
Iizuka

(10) Patent No.: US 12,463,084 B2
(45) Date of Patent: Nov. 4, 2025

(54) SHOWER HEAD AND SUBSTRATE PROCESSING APPARATUS

(71) Applicant: TOKYO ELECTRON LIMITED, Tokyo (JP)

(72) Inventor: Hachishiro Iizuka, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 438 days.

(21) Appl. No.: 17/759,609

(22) PCT Filed: Jan. 21, 2021

(86) PCT No.: PCT/JP2021/002083
§ 371 (c)(1),
(2) Date: Jul. 27, 2022

(87) PCT Pub. No.: WO2021/157374
PCT Pub. Date: Aug. 12, 2021

(65) Prior Publication Data
US 2023/0052858 A1 Feb. 16, 2023

(30) Foreign Application Priority Data

Feb. 7, 2020 (JP) ................................ 2020-020012

(51) Int. Cl.
*C23C 16/455* (2006.01)
*C23C 16/44* (2006.01)
(Continued)

(52) U.S. Cl.
CPC .... *H01L 21/68742* (2013.01); *C23C 16/4412* (2013.01); *C23C 16/45565* (2013.01); *C23C 16/50* (2013.01)

(58) Field of Classification Search
CPC ........ C23C 16/45544; C23C 16/45565; C23C 16/4408; C23C 16/4412
See application file for complete search history.

(56) References Cited

U.S. PATENT DOCUMENTS

| 2004/0082251 A1* | 4/2004 | Bach ................... H01J 37/3244 445/60 |
| 2011/0052833 A1* | 3/2011 | Hanawa ............ C23C 16/45574 134/1.1 |

FOREIGN PATENT DOCUMENTS

| JP | 2004-103630 A | 4/2004 |
| JP | 2006-237490 A | 9/2006 |

(Continued)

OTHER PUBLICATIONS

PCT International Search Report and Written Opinion, PCT Application No. PCT/JP2021/002083, Mar. 23, 2021, 12 pages (with English translation of PCT International Search Report).

*Primary Examiner* — Joseph A Miller, Jr.
(74) *Attorney, Agent, or Firm* — Fenwick & West LLP

(57) ABSTRACT

There is provided a shower head disposed in a processing container where a substrate is accommodated and configured to discharge a gas to the substrate in a shower pattern, comprising: a main body portion having a facing surface facing a stage disposed in the processing container to place the substrate thereon; a covering section that covers a surface formed on an opposite side of the facing surface of the main body portion, and forms, between the surface and the covering section, an exhaust space that is exhausted by an exhaust mechanism; a plurality of exhaust hole forming regions disposed on the facing surface apart from each other and each having a plurality of exhaust holes; a plurality of discharge holes disposed for each of the exhaust hole forming regions on the facing surface to surround each of the plurality of exhaust hole forming regions and configured to discharge the gas; a diffusion space disposed to be shared by the plurality of discharge holes, where the gas supplied to the main body portion is diffused to be supplied to each of the plurality of discharge holes; and an exhaust path disposed in the main body portion to be connected to the exhaust holes (Continued)

and opened to the exhaust space in order to exhaust the gas discharged from the discharge holes into the exhaust space.

16 Claims, 17 Drawing Sheets

(51) Int. Cl.
*C23C 16/50* (2006.01)
*H01L 21/687* (2006.01)

(56) References Cited

FOREIGN PATENT DOCUMENTS

| | | | |
|---|---|---|---|
| JP | 2009-260258 A | | 11/2009 |
| JP | 2015/206105 | * | 11/2015 |
| JP | 2015-206105 A | | 11/2015 |

* cited by examiner

SHOWER HEAD AND SUBSTRATE PROCESSING APPARATUS

TECHNICAL FIELD

The present disclosure relates to a shower head and a substrate processing apparatus.

BACKGROUND

In a process of manufacturing a semiconductor device, a semiconductor wafer (hereinafter referred to as a "wafer"), which is a substrate, is accommodated in a processing container constituting a substrate processing apparatus and undergoes heat treatment or plasma treatment. Such treatment on the wafer is performed, for example, by discharging a gas from a shower head disposed in the processing container. For example, Patent Document 1 discloses a shower head formed by laminating a plurality of plate-shaped members and having a first discharge hole and a second discharge hole. The shower head has an exhaust port to exhaust a gas discharged from each of the first discharge hole and the second discharge hole.

PRIOR ART DOCUMENTS

Patent Documents

Patent Document 1: Japanese Laid-open Patent Publication No, 2009-260258

SUMMARY

Problems to Be Resolved by the Invention

The present disclosure provides a technique capable of performing uniform processing on a substrate and obtaining high exhaust performance in a shower head for discharging and exhausting a gas.

Means for Solving the Problem

A shower head according to the present disclosure is disposed in a processing container where a substrate is accommodated, is configured to discharge a gas to the substrate in a shower pattern, and comprises:
- a main body portion having a facing surface facing a stage disposed in the processing container to place the substrate thereon;
- a covering section that covers a surface formed on an opposite side of the facing surface of the main body portion, and forms, between the surface and the covering section, an exhaust space that is exhausted by an exhaust mechanism;
- a plurality of exhaust hole forming regions disposed on the facing surface apart from each other and each having a plurality of exhaust holes;
- a plurality of discharge holes disposed for each of the exhaust hole forming regions on the facing surface to surround each of the plurality of exhaust hole forming regions and configured to discharge the gas;
- a diffusion space disposed to be shared by the plurality of discharge holes, where the gas supplied to the main body portion is diffused to be supplied to each of the plurality of discharge holes; and
- an exhaust path disposed in the main body portion to be connected to the exhaust holes and opened to the exhaust space in order to exhaust the gas discharged from the discharge holes into the exhaust space.

Effect of the Invention

In accordance with the present disclosure, it is possible to perform uniform processing on a substrate and obtain high exhaust performance in a shower head for discharging and exhausting a gas.

DETAILED DESCRIPTION

First Embodiment

Figure 1:
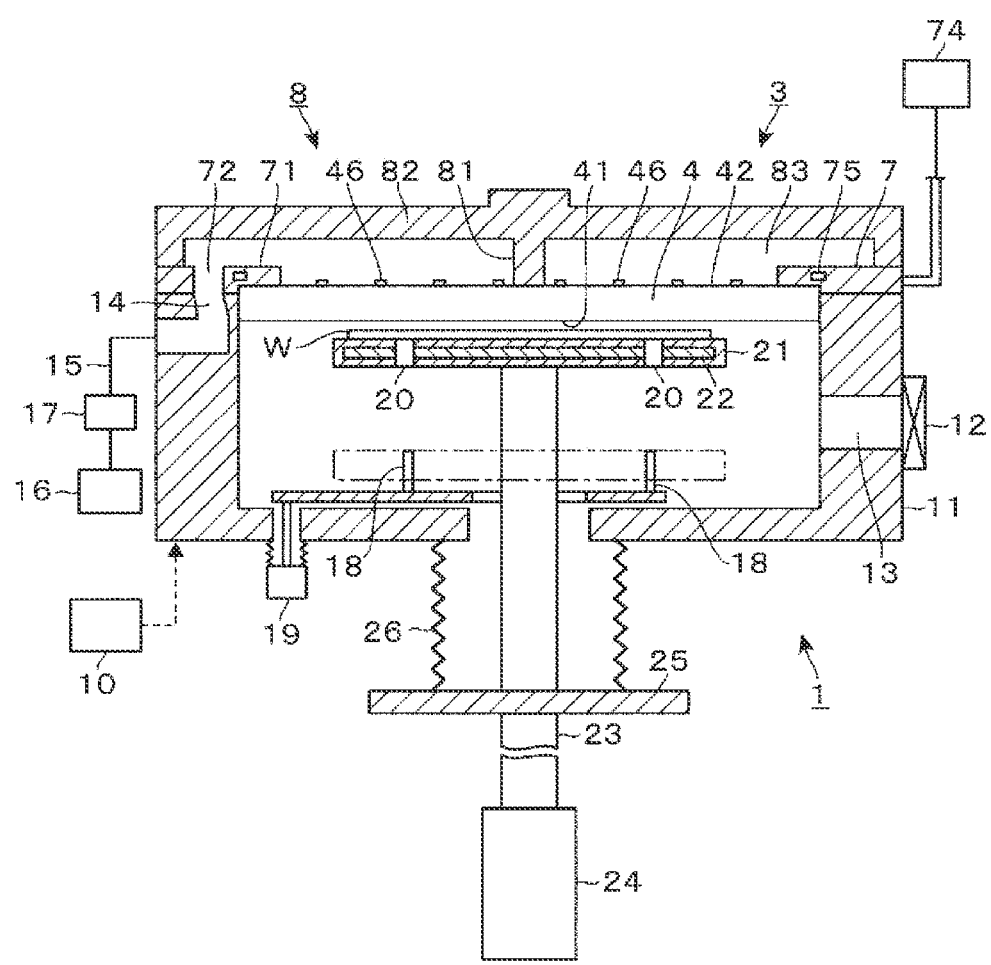
FIG. 1 is a vertical sectional side view of a film forming apparatus to which a shower head according to a first embodiment of the present disclosure is applied.

A film forming apparatus 1 as a substrate processing apparatus, which includes a shower head 3 according to a first embodiment of the present disclosure, will be described with reference to the vertical sectional side view of FIG. 1. The film forming apparatus 1 forms a titanium nitride (TiN) film on a wafer W as a substrate by atomic layer deposition (ALD). The film forming apparatus 1 performs film formation by heat without using plasma. The film forming apparatus 1 includes a cylindrical processing container 11. The shower head 3 is disposed at a ceiling portion of the processing container 11, and discharges a gas to the wafer W in a shower pattern in order to form a film. Further, as will be described in detail later, the shower head 3 has exhaust holes to exhaust the inside of the processing container 11.

A transfer port 13 for the wafer W, which can be opened and closed by a gate valve 12, is formed at a sidewall of the processing container 11. Further, an exhaust path 14 for exhausting a gas from the shower head 3 is formed at a sidewall of the processing container 11. An upstream end of an exhaust line 15 is connected to the exhaust path 14 and a downstream end of the exhaust line 15 is connected to a vacuum pump 16. A pressure control mechanism 17 including a valve is interposed in the exhaust line 15, and the inside of the processing container 11 is adjusted so as to have a vacuum atmosphere of a desired pressure depending on an opening degree of the valve. The pressure control mechanism 17 and the vacuum pump 16 constitute an exhaust mechanism.

A stage 21 for horizontally placing the wafer W is disposed in the processing container 11, and a heater 22 for heating the wafer W is embedded in the stage 21, A support column 23 penetrating through the bottom portion of the processing container 11 and extending vertically has an upper end connected to a bottom central portion of the stage 21 and a lower end connected to an elevating mechanism 24. The elevating mechanism 24 can move the stage 21 to a lowered position and a raised position respectively indicated by a dotted line and a solid line in FIG. 1. The lowered position is a position where the wafer W is delivered to and from a transfer mechanism (not shown) for the wafer W entering the processing container 11 from the transfer port 13. The raised position is a position where the wafer W is processed.

A flange 25 is formed at a portion of the support column 23 on the outside of the processing container 11. The flange 25 and the bottom portion of the processing container 11 are connected by a bellows 26, so that the airtightness in the processing container 11 is ensured. Further, three pins 18 (only two are shown in FIG. 1) are disposed at the inner lower portion of the processing container 11 and are connected to the elevating mechanism 19. When the stage 21 is located at the lowered position, the pins 18 are moved up and down, and the tip ends of the pins 18 protrude and retract with respect to the upper surface of the stage 21 to transfer the wafer W between the stage 21 and the transfer mechanism. The pins 18 are moved up and down through throughholes 20 formed in the stage 21.

A conventional substrate processing apparatus will be described before the description of the shower head 3. As the conventional substrate processing there is known a substrate processing apparatus in which a stage on which a substrate is placed and a shower head are arranged in a processing container to face each other, and a gas is discharged from multiple discharge holes which open on a surface of the shower head facing the stage and is exhausted from an exhaust port which opens on a sidewall of the processing container. Instead of the exhaust port disposed on the sidewall, an exhaust port disposed above the substrate along the outer periphery of the shower head or disposed below the substrate along the outer periphery of the stage is known.

However, when the exhaust port is disposed on the sidewall of the processing container as described above, the distances from each discharge hole formed in the facing surface to the exhaust port are different. Therefore, the lengths of gas flow lines from each discharge hole to the exhaust port are different from each other, and a gas flow is formed across the plane of the substrate in the circumferential direction. Hence, the processing may not be uniform in the circumferential direction of the substrate. Further, when the exhaust port is disposed along the outer periphery of the shower head or the outer periphery of the stage as described above, the gas discharged to the central portion of the substrate and the gas discharged to the peripheral portion of the substrate flow toward the outer periphery of the substrate, but the lengths of the gas flow lines are different from each other. Accordingly, the processing may not be uniform in the radial direction of the substrate. In the configuration of the conventional substrate processing apparatus, the gas flow is not uniform at each part on the plane of the substrate, so that it may be difficult to perform uniform processing on the plane of the substrate.

The shower head 3 is configured to suppress non-uniformity of processing on the plane of the wafer W. Further, in order to improve the throughput of the processing of the wafer W, it is required to quickly exhaust and remove a gas in the processing container. The shower head 3 is configured to obtain such high exhaust performance. Hereinafter, the shower head 3 will be described with reference to the vertical sectional side view of FIG. 2 and the horizontal sectional plan view of FIG. 3.

First, an outline of the configuration of the shower head 3 will be described. The shower head 3 is composed of a main body portion 4, a gas distribution plate 7, a lid portion 8, and a support column 81. The main body portion 4 is formed as a circular thick plate and blocks an opening formed at the ceiling portion of the processing container 11. The lower part of the main body portion 4 is surrounded by the sidewall of the processing container 11. Therefore, the main body portion 4 forms the ceiling portion of the processing container 11. The bottom surface of the main body portion 4 forms a facing surface 41 facing the stage 21, and discharge holes 51 and exhaust holes 52 are formed on the facing surface 41.

The gas distribution plate 7 is formed in a circular ring shape that is concentric with the main body portion 4. The gas distribution plate 7 is horizontally disposed on the sidewall of the processing container 11, and surrounds the upper part of the main body portion 4. At the inner periphery of the gas distribution plate, the upper part protrudes toward the central portion compared to the lower part to form an inner peripheral projecting portion 71, and covers the peripheral portion of the upper surface of the main body portion 4.

The lid portion 8 which is a covering portion is provided on the gas distribution plate 7, and includes a horizontal circular upper plate 82 facing the main body portion 4. The peripheral portion of the upper plate 82 is formed along the peripheral portion of the gas distribution plate 7 and projects downward to be supported on the peripheral portion of the gas distribution plate 7. The support column 81 extends downward from the central portion of the upper plate 82, and the lower end of the support column 81 is connected to the main body portion 4 to support the main body portion 4. By forming the lid portion 8 as described above, a space surrounded by the lid portion 8 and the upper surface of the main body portion 4 is provided. The space is connected to the exhaust path 14 formed on the sidewall of the processing container 11 via an exhaust path 72 which is a through-hole provided in the peripheral portion of the gas distribution plate 7, so that the space is an exhaust space exhausted by the vacuum pump 16. In the drawings, this exhaust space is shown as a reference numeral 83, the upper surface of the main body portion 4 forming the exhaust space 83 is referred to as an exhaust space forming surface 42.

The gas distribution plate 7 is provided with a gas inlet line 73 formed so as to extend along the radial direction of the gas distribution plate 7, and the upstream end of the gas inlet line 73 opens toward the outer periphery of the gas distribution plate 7 and is connected to a gas supply source 74. The gas supply source 74 is configured to supply $TiCl_4$ gas and $NH_3$ gas as film forming gases for forming a TiN film, and $N_2$ gas as a purge gas for purging the processing container 11 to the gas inlet line 73, and includes gas supply devices such as a valve, a mass flow controller, and the like, or a storage for each gas.

The downstream end of the gas inlet line 73 is connected to an annular flow path 75 formed along the circumference of the gas distribution plate 7. A plurality of locations separated at equal intervals in the circumferential direction of the annular flow path 75 are extended diagonally downward toward the inner peripheral side of the gas distribution plate 7 to form connection paths 76. The downstream end of each connection path 76 opens toward the bottom surface of the inner peripheral projecting portion 71 and is connected to a flow path of the main body portion 4 which will be described later. In this way, the gas distribution plate 7 is configured to disperse and supply the gas to a plurality of locations in the circumferential direction of the main body portion 4 so that the gas is uniformly discharged from each discharge hole 51 of the main body portion 4.

Next, the outline of the configuration of the main body portion 4 will be described. As described above, the main body portion 4 has a diffusion space where the gas supplied from the gas distribution plate 7 diffuses, and the gas diffused in the diffusion space is discharged from the discharge holes 51 of the facing surface 41. The main body portion 4 is configured such that the discharged gas flows into the exhaust space 83 from the exhaust holes 52 of the facing surface 41 through the exhaust path and is removed, Although the shower head 3 is described as being applied to the film forming apparatus 1 that does not generate plasma has been described, a modification of the shower head 3 is applied to the plasma processing apparatus, as will be described later. Since the main body portion 4 has, for example, a common configuration both the case where it is applied to the film forming apparatus 1 and the case where it is applied to the plasma processing apparatus, the main body portion 4 is configured to obtain advantages even when applied to such plasma processing apparatus. The advantages will be described later together with the configuration of the main body portion 4.

Hereinafter, the main body portion 4 will be described in detail. The main body portion 4 includes a first circular plate 43, a second circular plate 44, and a circular support ring 45 that are concentric with each other. The support ring 45 surrounds the first circular plate 43. The lower part of the inner peripheral edge of the support ring 45 projects toward the center of the ring, and supports the flange 49 formed at the upper part of the outer periphery of the first circular plate 43. The second circular plate 44 is disposed so as to overlap the support ring 45 and the first circular plate 43 from above. Bolts 46 are inserted, from the upper side of the second circular plate 44, into vertically long recesses formed by through-holes formed at a plurality of positions of the second circular plate 44 and shallow recesses respectively formed in the support ring 45 and the first circular plate 43 to overlap the through-holes. Then, the support ring 45 and the first circular plate 43 are coupled to the second circular plate 44 by the bolts 46 which are coupling members. Regarding the through-hole of the second circular plate 44, the through-hole through which the bolt 46 for coupling the support ring 45 is inserted is shown as a reference numeral 47, and the through-hole 47 is formed at the peripheral portion of the second circular plate 44. The positions of the bolts 46 that connect the second circular plate 44 and the first circular plate 43 will be described later.

Figure 2:
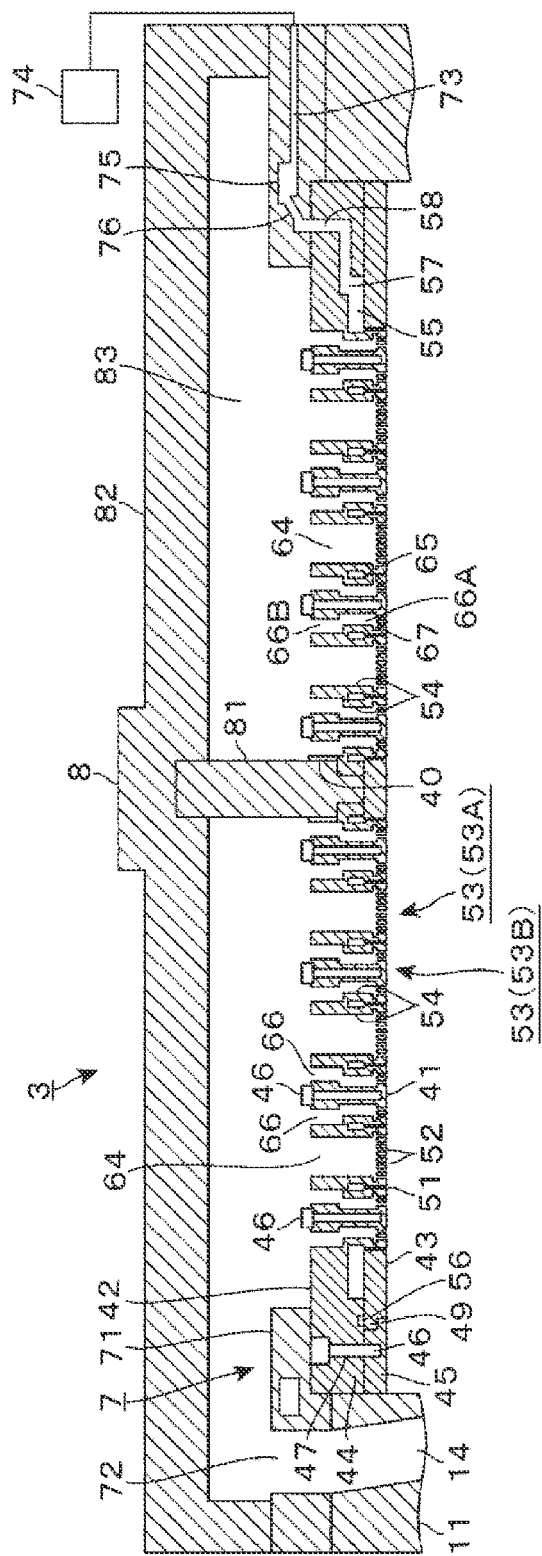
FIG. 2 is a vertical sectional side view of the shower head.

In FIG. 2, some of the dividing lines of the first circular plate 43 that is a first member and the second circular plate 44 that is a second member are omitted to avoid complicated illustration. The above-described facing surface 41 is the bottom surface of the first circular plate 43, and the exhaust space forming surface 42 is the upper surface of the second circular plate 44. The support column 81 is connected to the first circular plate 43 through a through-hole 40 formed in the second circular plate 44. Although the support column 81 is connected to the first circular plate 43 and the lid portion 8 by bolts, the bolts for connecting the support column 81 are not illustrated.

Figure 3:
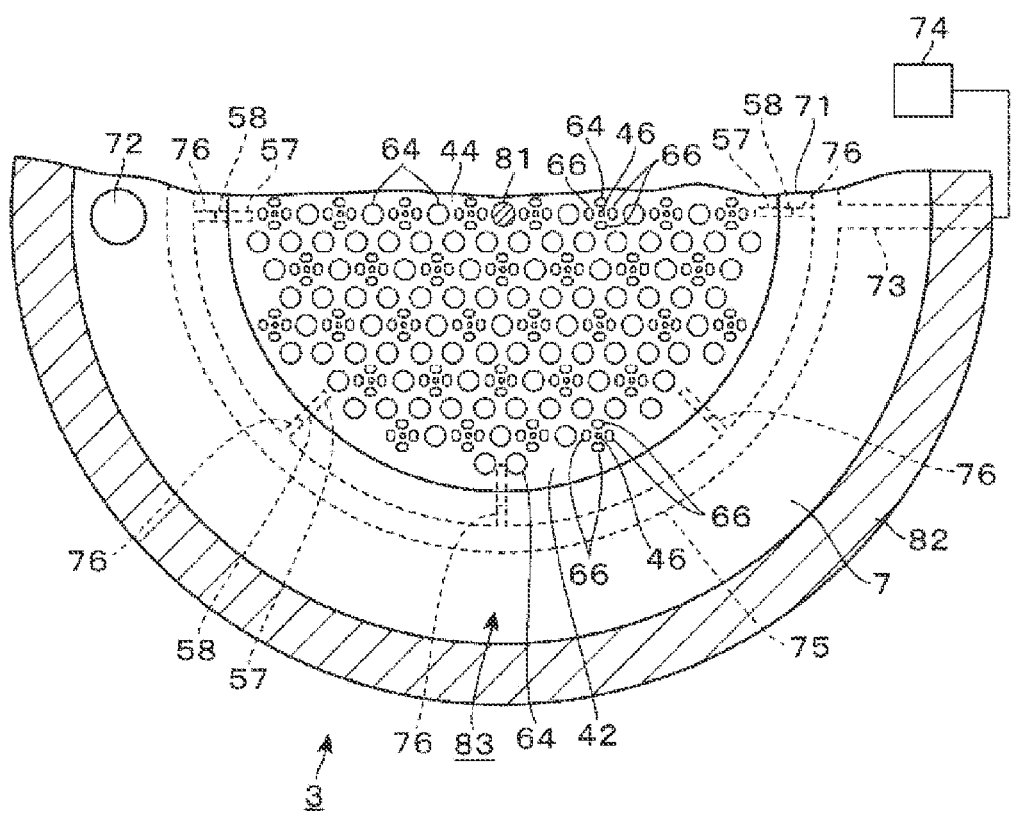
FIG. 3 is a horizontal sectional plan view of the shower head.
Figure 4:
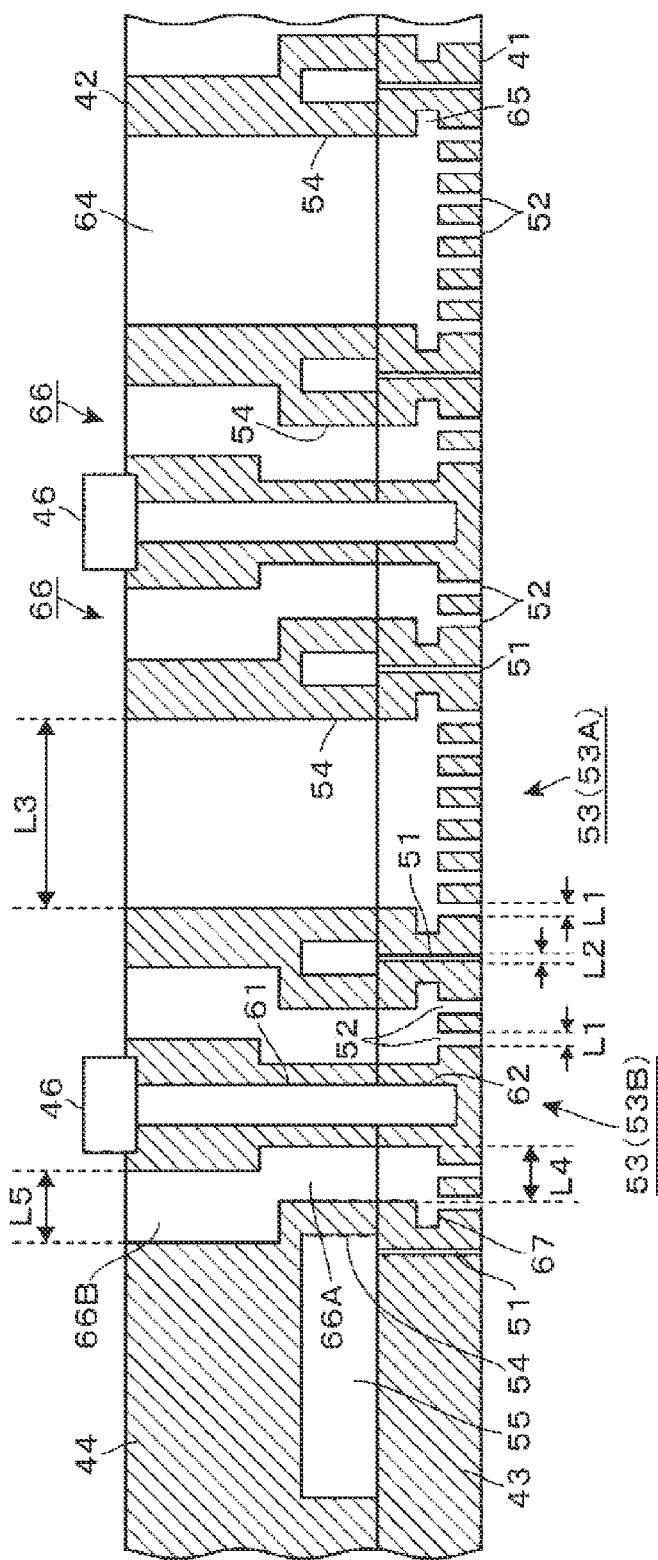
FIG. 4 is a vertical sectional side view of the shower head.
Figure 5:
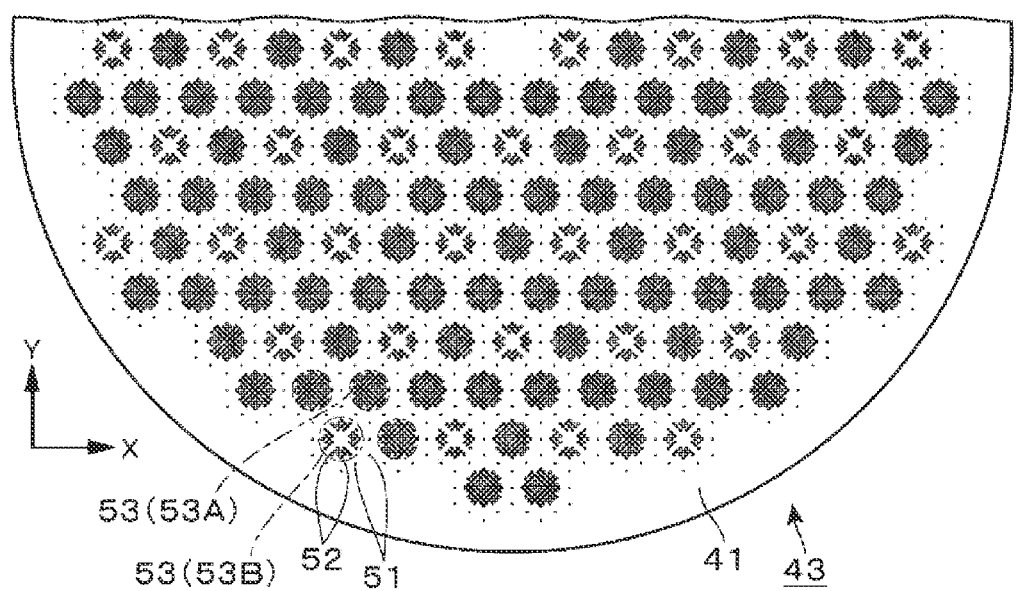
FIG. 5 is a bottom view of a first circular plate constituting the shower head.
Figure 6:
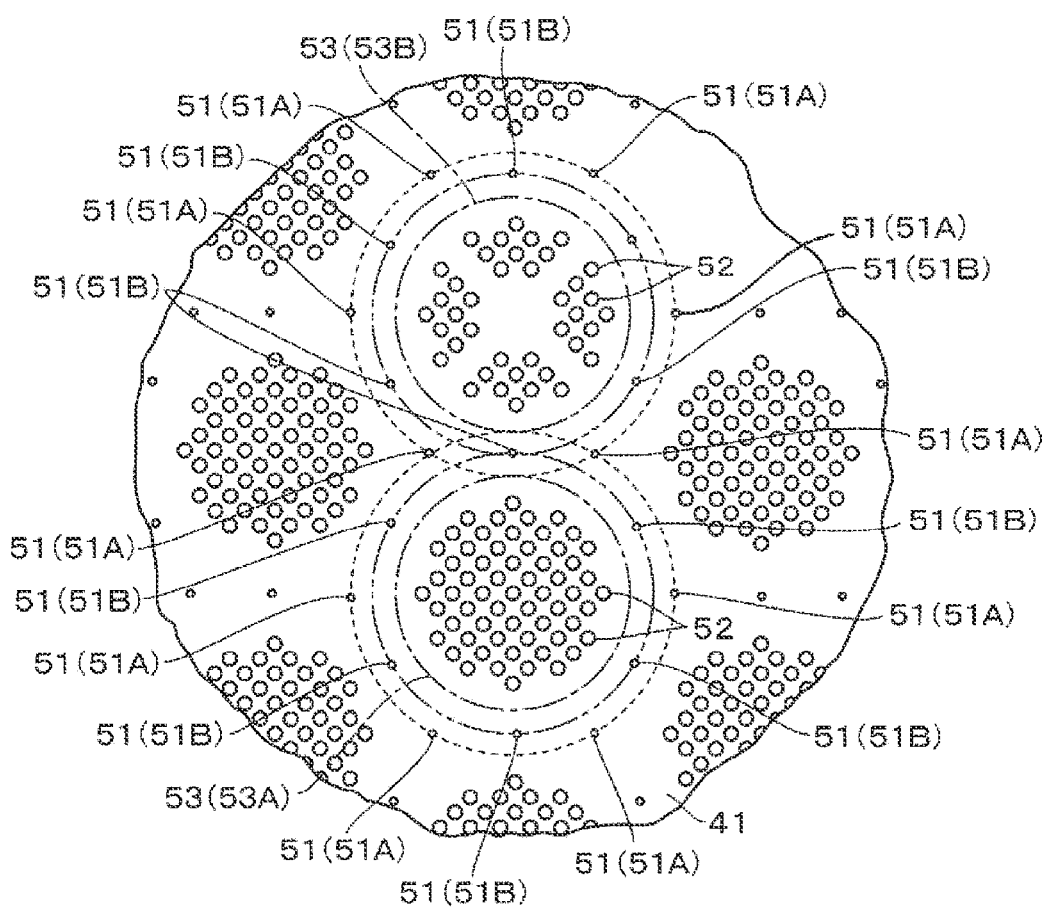
FIG. 6 is a bottom view of the first circular plate.
Figure 7:
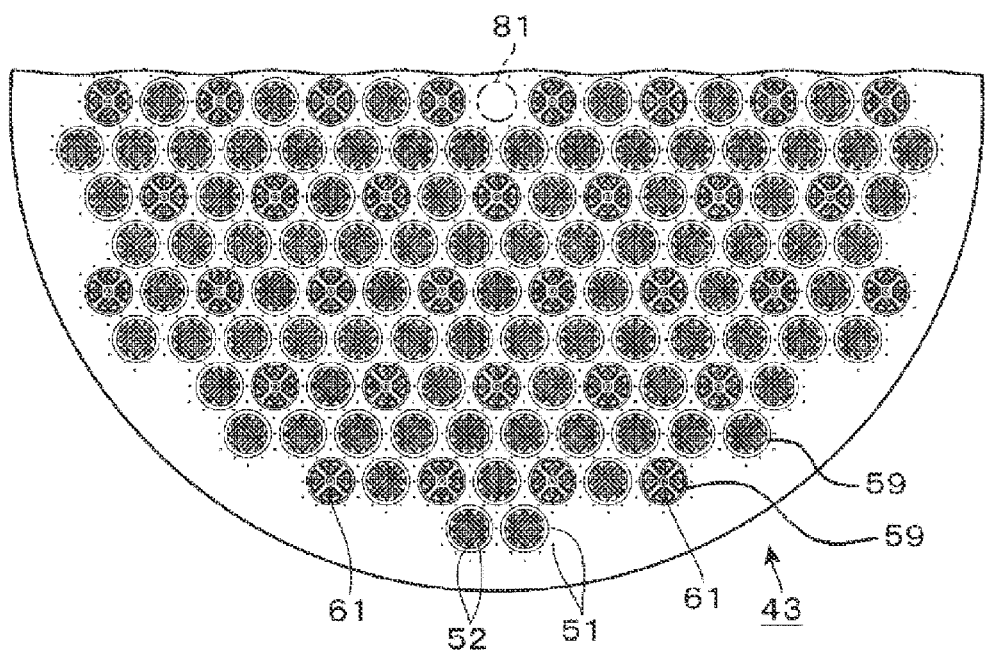
FIG. 7 is a top view of the first circular plate.
Figure 8:
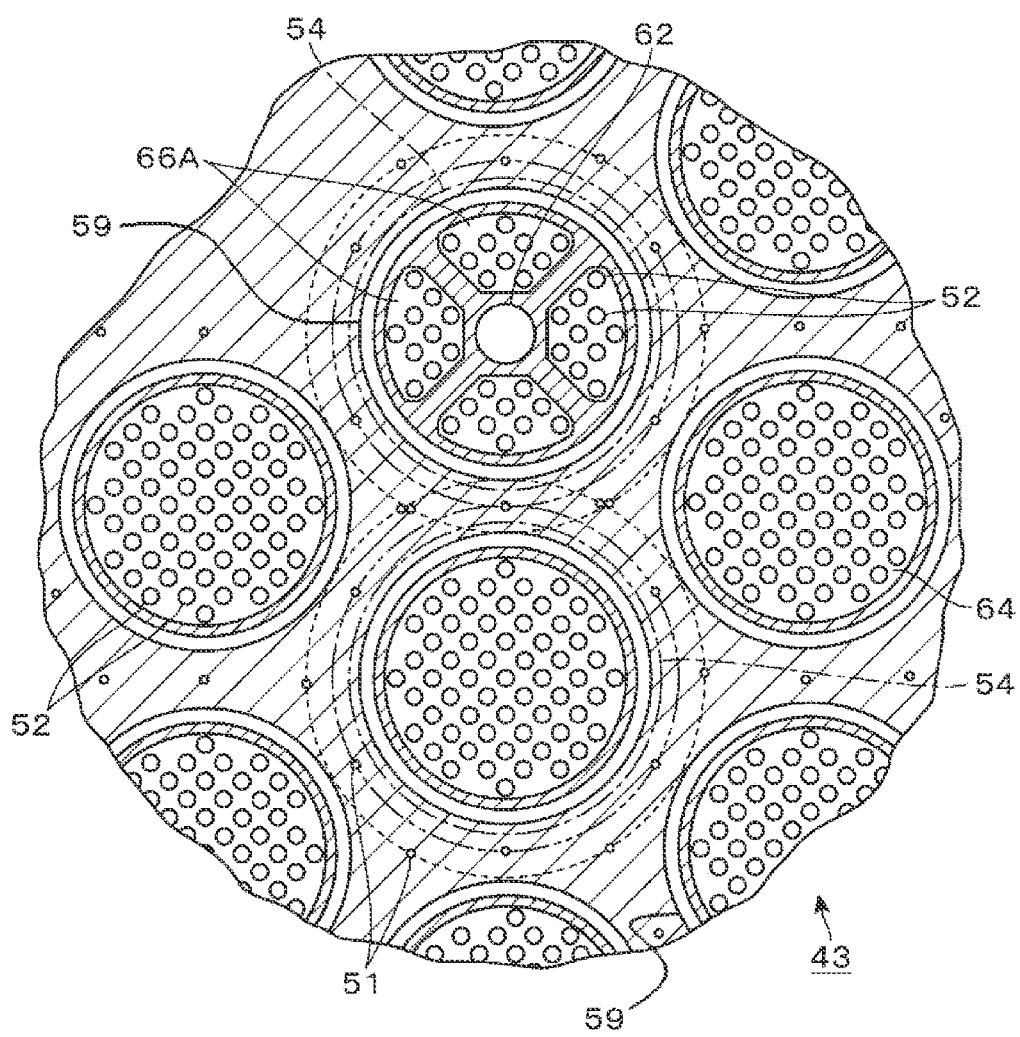
FIG. 8 is a top view of the first circular plate.
Figure 9:
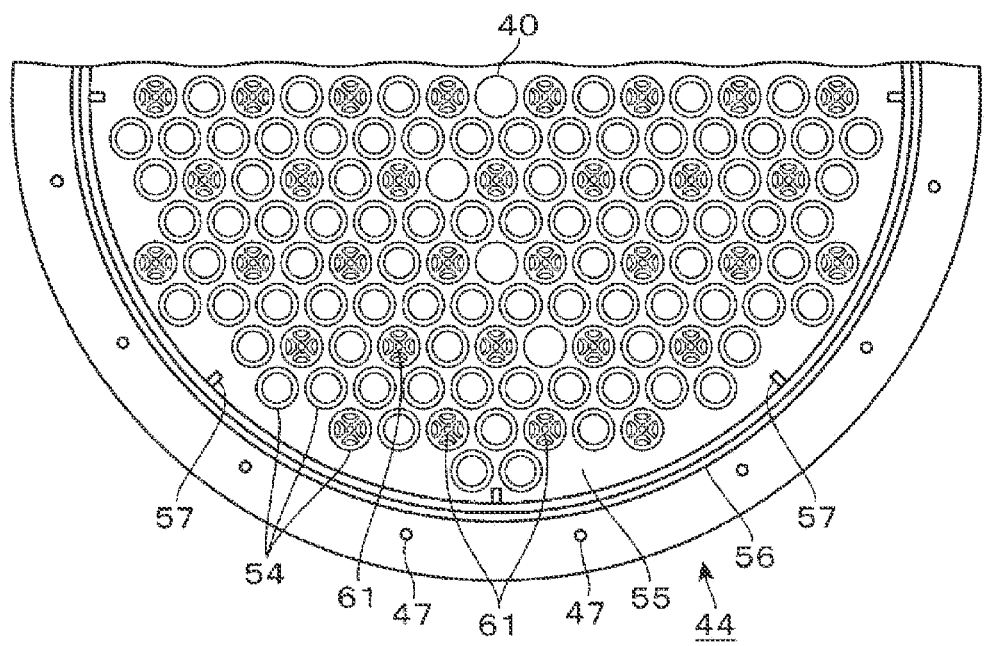
FIG. 9 is a bottom view of a second circular plate constituting the shower head.
Figure 10:
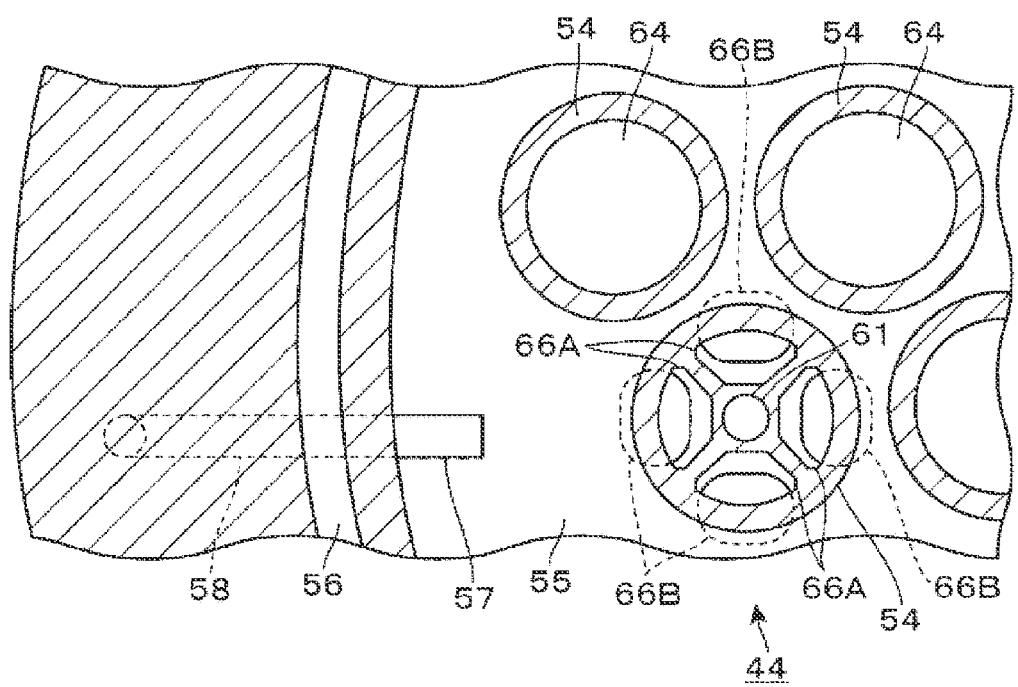
FIG. 10 is a bottom view of the second circular plate.

Next, the description will be continued with reference to FIGS. 4 to 10. FIG. 4 is a vertical sectional side view of the main body portion 4, in which a part of FIG. 2 is enlarged to explain the configuration of the gas flow path (including the exhaust path) in the main body portion 4. FIGS. 5 and 6 show the bottom surface of the first circular plate 43, i.e., the facing surface 41. FIGS. 7 and 8 show the upper surface of the first circular plate 43. FIGS. 9 and 10 show the bottom surface of the second circular plate 44, FIG. 3 shows the upper surface of the second circular plate 44. The first circular plate 43 and the second circular plate 44 have holes and recesses through which the bolts 46 are inserted, and recesses or holes forming the gas flow paths. In FIGS. 8 and 10, the region where the recesses or the holes are not formed is hatched to distinguish the region from the recesses and the holes. In other words, the hatching does not show a cross section, but shows the height difference of each plane.

As shown in FIGS. 5 and 6, the discharge holes 51 and the exhaust holes 52 open on the bottom surface (the facing surface 41) of the first circular plate 43 as described above, and multiple circular exhaust hole forming regions 53, each including multiple exhaust holes 52, are distributed on the facing surface 41. The dashed-dotted lines in FIGS. 5 and 6 are virtual lines indicating the exhaust hole forming regions 53. The multiple exhaust hole forming regions 53 are arranged at equal intervals to form a line in the horizontal direction (X direction) in plan view, and a plurality of these lines are arranged at equal intervals in the vertical direction (Y direction). The horizontal positions of the exhaust hole forming regions 53 are different in adjacent lines, and the horizontal positions of the exhaust hole forming regions 53 are the same in every other line of the exhaust hole forming regions 53. Therefore, in plan view, the exhaust hole forming regions 53 in lines adjacent to each other in the vertical direction and the exhaust hole forming regions 53 in lines adjacent to each other in the horizontal direction are arranged in a staggered manner. Since the central portion of the facing surface 41 overlaps the support column 81, the exhaust hole forming region 53 is not formed at the central portion of the facing surface 41.

In each exhaust hole forming region 53, the exhaust holes 52 open in a first layout or a second layout. In the first layout, the exhaust holes 52 are distributed and open in the entire exhaust hole forming region 53. In the second layout, the exhaust holes 52 open in a region excluding the cross region in the center of the exhaust hole forming region 53. In other words, the multiple exhaust holes 52 are disposed at each of four locations spaced apart from each other in the circumferential direction of the exhaust hole forming region 53. Therefore, the number of exhaust holes 52 included in the exhaust hole forming region 53 of the first layout is different from the number of exhaust holes 52 included in the exhaust hole forming region 53 of the second layout, and a smaller number of exhaust holes are formed in the exhaust hole forming region 53 of the second layout. Hereinafter, the exhaust hole forming region 53 of the first layout and the exhaust hole forming region 53 of the second layout may be distinguished from each other and referred to as "exhaust hole forming region 53A" and "exhaust hole forming region 53B", respectively. The exhaust hole forming regions 53 form lines in the horizontal direction in plan view as described above, but every other line including the exhaust hole forming regions 53B is provided, and the exhaust hole forming region 53A (another exhaust hole forming region) and the exhaust hole forming region 53B (one exhaust hole forming region) are alternately provided in the same line.

Next, the arrangement of the discharge holes 51 on the facing surface 41 will be described. In one exhaust hole forming region 53, six discharge holes 51 are disposed to surround the exhaust hole forming region 53. In FIG. 6, for convenience of description, a reference numeral 51A indicates the six discharge holes 51 surrounding the exhaust hole forming region 53. When a virtual line (indicated by a dotted line in FIG. 6) is drawn along the six discharge holes 51A surrounding each exhaust hole forming region 53, circles of the same size are obtained. In other words, for each exhaust hole forming region 53, the discharge holes 51A are arranged along a circle of the same size surrounding the exhaust hole forming regions 53. Assuming that adjacent two exhaust hole forming regions 53 are a first exhaust hole forming region 53 and a second exhaust hole forming region 53 respectively, the discharge holes 51A (first discharge hole group) surrounding the first exhaust hole forming region 53 and the discharge holes 51A (second discharge hole group) surrounding the second exhaust hole forming region 53 include two common discharge holes 51. Therefore, the circles of the virtual lines (first virtual line and second virtual line) respectively drawn for the adjacent exhaust hole forming regions 53 intersect with each other.

Since the discharge holes 51A are arranged to surround the exhaust hole forming region 53 as described above, the gas discharged from each discharge hole 51A surrounding the exhaust hole forming region 53 to the stage 21 uniformly flows toward the exhaust holes 52. By providing multiple sets of the discharge holes 51A and the exhaust hole forming region 53 surrounded by the discharge holes 51A on the facing surface 41 in this way, the gas uniformly flows from the discharge holes 51A toward the exhaust holes 52 in each in-plane portion of the wafer W. Further, since a large number of exhaust holes 52 open in each exhaust hole forming region 53, high exhaust performance can be ensured.

As described above, the common discharge holes 51 are included in two groups of the discharge holes 51A surrounding the adjacent exhaust hole forming regions 53, so that multiple sets of the exhaust hole forming region 53 and the discharge holes 51 can be formed on the facing surface 41. Therefore, the number of exhaust holes 52 formed on the facing surface 41 can be increased, which makes it possible to obtain higher exhaust performance.

On the facing surface 41, another discharge holes 51 different from the discharge holes 51A are formed, and these discharge holes 51 are referred to as "discharge holes 51B" in FIG. 6, for convenience of description. The discharge holes 51B open at an intermediate position between the adjacent exhaust hole forming regions 53B, and are provided to improve the uniformity of arrangement of the discharge holes 51 on the facing surface 41 and to improve the uniformity of in-plane processing of the wafer W by discharging a gas also at the intermediate position. By arranging the exhaust hole forming regions 53 in a staggered manner as described above, the layout in which six discharge holes 51B are arranged along a circle to surround one exhaust hole forming region 53 is obtained. In FIG. 6, the circles formed by the discharge holes 51B are indicated by virtual dashed double-dotted lines. The circle indicated by the dashed double-dotted line is concentric with the dashed-dotted line circle connecting the discharge holes 51A, and has a smaller diameter than the dashed-dotted line circle, By arranging the discharge holes 51A and 51B as described above, the discharge holes 51A and the discharge holes 51B surrounding one exhaust hole forming region 53 are arranged in a regular hexagon, respectively.

As shown in FIG. 4, a hole diameter L1 of the exhaust hole 52 is greater than a hole diameter 12 of the discharge hole 51. The hole diameter L1 is 0.5 mm to 2.5 mm, and more specifically, 1.2 mm, for example. The hole diameter L2 is 0.1 mm to 1.0 mm, and more specifically, 0.5 mm, for example. As described above, the main body portion 4 may be applied to the plasma processing apparatus. In the case of applying the main body portion 4 to the plasma processing apparatus, if the hole diameter of the discharge hole 51 is excessively large, in the diffusion space described later, the probability that ions generated from a plasma generating gas reach the lower side in the discharge holes 51 without colliding with the hole walls of the discharge holes 51 is high. The ions that have reached the lower side of the discharge holes 51 causes electric discharge in the discharge holes 51, and the electric discharge spreads toward the upstream side of the gas flow path of the shower head 3. Accordingly, the wall surface of the gas flow path may be damaged, and particles may be generated from the wall surface of the gas flow path. Hence, it is preferable that the hole diameter 12 of the discharge hole 51 is relatively small.

On the other hand, since the gas whose energy has decreased after being discharged from the discharge holes 51 flows into the exhaust holes 52, even if the hole diameter of the exhaust holes 52 is relatively large, electric discharge in the exhaust holes 52 is unlikely to occur, and, for the purpose of obtaining high exhaust performance as described above, it is preferable to make the hole diameter of the exhaust hole 52 relatively large, Therefore, as described above, it is preferable that the hole diameter 11 of the exhaust hole 52 is greater than the hole diameter 12 of the discharge hole 51. However, if the hole diameter 11 of the exhaust hole 52 is excessively large, electric discharge is likely to occur in the exhaust hole 52, so that it is preferable that the hole diameter 11 is within the above-described range.

Referring back to the description of the configuration of the first circular plate 43 and the second circular plate 44, as shown in FIGS. 9 and 10, the lower surface side of the second circular plate 44 is configured to form a concave portion by being scraped so that a large number of circular portions 54 remain. Therefore, from a different point of view, the circular portion 54 protrudes from the bottom surface of the concave portion, and the periphery of the concave portion is formed along the periphery of the second circular plate 44. The circular portion 54 is disposed at each position overlapping the exhaust hole forming region 53, and the virtual dashed-dotted lines indicating the exhaust hole forming regions 53 shown in FIGS. 5 and 6 indicate the circular portions 54.

As described above, the first circular plate 43 overlaps the second circular plate 44, so that the concave portion is blocked by the first circular plate 43 to form a flat gas diffusion space 55. Each of the discharge holes 51 is connected to the lower part of the diffusion space 55. Therefore, the diffusion space 55 is a space commonly provided in each discharge hole 51. In FIGS. 9 and 10, a reference numeral 56 indicates an annular groove formed along the circumference of the diffusion space 55 on the lower surface of the second circular plate 44. Although a seal member such as a gasket or an O-ring is formed in the groove 56, the illustration of the seal member is omitted.

Gas inlet ports 57 open above the peripheral portion of the bottom surface of the concave portion, i.e., the peripheral portion of the diffusion space 55. The gas inlet ports 57 open at multiple locations in the circumferential direction of the diffusion space 55, and form the downstream ends of gas inlet lines 58 formed at the peripheral portion of the second circular plate 44. The upstream side of the gas inlet line 58 bends upward after reaching the outer peripheral side of the second circular plate 44, and then opens at the peripheral portion of the upper surface of the second circular plate 44 and is connected to the connection path 76 of the gas distribution plate 7 described above. In other words, each gas is supplied from the gas supply source 74 to the diffusion space 55 through the gas inlet ports 57, As described above, the first circular plate 43 and the second circular plate 44 has the exhaust path that connects the exhaust holes 52 and the exhaust space 83, Each of the exhaust paths is provided for each exhaust hole forming region 53, and is formed by a flow path vertically penetrating the circular portion 54. Therefore, the circular portion 54 is a cylindrical body, and the peripheral wall thereof separates the diffusion space 55 and the exhaust path. Annular grooves 59 formed on the upper surface of the first circular plate 43 shown in FIGS. 7 and 8 are formed along the peripheral portions of each circular portion 54, and a seal member (not shown) such as a gasket or an O-ring is disposed in the groove 59 to reliably separate the exhaust path and the diffusion space 55. In FIGS. 2 and 4, the grooves 59 are not illustrated.

Further, the bolt 46 is provided to reach the first circular plate 43 while penetrating through the center of the circular portion 54 disposed on the exhaust hole forming region 53B, and the first circular plate 43 and the second circular plate 44 are coupled by the bolt 46. In other words, the bolt 46 is provided to overlap the exhaust hole forming regions 53B. In the drawings, a reference numeral 61 indicates through-hole formed in the second circular plate 44 to allow the bolt 46 to penetrate therethrough, and a reference numeral 62 indicates recess overlapping the through-hole 61 on the first circular plate 43 and through which the lower end of the bolt 46 is inserted. Since the exhaust path corresponding to the exhaust hole forming region 53B is formed so as not to interfere with the through-holes 61 and the recess 62, the layouts of the exhaust holes 52 in the exhaust hole forming regions 53A and 53B are different.

Hereinafter, the configuration of the exhaust paths will be described in detail. A reference numeral 64 indicates an exhaust path corresponding to the exhaust hole forming region 53A, and a reference numeral 66 indicates an exhaust path corresponding to the exhaust hole forming region 53B. One exhaust path 64 is provided for one exhaust hole forming region 53A. The exhaust path 64 has a circular shape in plan view and is concentric with the circular portion 54. The lower end side of the exhaust path 64 is expanded in diameter to form a diameter-expanded portion 65, and each exhaust hole 52 of the exhaust hole forming region 53A opens on the bottom surface of the diameter-expanded portion 65. The diameter-expanded portion 65 is formed in the central portion in the height direction of the first circular plate 43, i.e., below the diffusion space 55. In the exhaust path 64, a hole diameter L3 of a portion above the diameter-expanded portion 65 is, for example, 8 mm to 20 mm, and more specifically, for example, 16 mm.

Four exhaust paths 66 are provided for one exhaust hole forming region 53B, and are spaced apart from each other in the circumferential direction of the bolt 46 to surround the bolt 46. As described above, four portions where a large number of the exhaust holes 52 are formed are provided in the exhaust hole forming region 53B, and each exhaust hole 52 at one portion is connected to one exhaust path 66. Since the exhaust path 66 is formed as described above, as shown in FIGS. 7 to 10, a cross beam is formed on the upper side of the first circular plate 43 and the lower side of the second circular plate 44 at position overlapping with each exhaust hole forming region 53B.

Further, as shown in FIG. 4, the exhaust path 66 bend so as to form a step while extending in the vertical direction. The lower side of the step is a lower exhaust path 66A, and the upper side of the step is an upper exhaust path 66B. The wall surface of the upper exhaust path 66B on the bolt 46 side is formed at a position farther from the central axis of the bolt 46 than the lower exhaust path 66A so as not to interfere with the head of the bolt 46. The upper part of the lower exhaust path 66A is formed at the circular portion 54. The lower end of the lower exhaust path 66A is configured as a diameter-expanded portion 67 that is further separated from the bolt 46 compared to the side surface separated from the bolt 46, and each exhaust hole 52 opens on the bottom surface of the diameter-expanded portion 67. The diameter-expanded portion 67 is formed at the central portion in the height direction of the first circular plate 43, i.e., below the diffusion space 55.

On the side surface of the lower exhaust path 66A, the length between the position closest to the bolt 46 and the position farthest from the bolt 46 is set to 14. On the side surface of the upper exhaust path 66B, the length between the position closest to the bolt 46 and the position farthest from the bolt 46 is set to 15. The length 15 is greater than the length L4, so that the upper exhaust path 66B has a larger cross-sectional area of the flow path (exhaust path) than the lower exhaust path 66A. Therefore, the conductance of the upper exhaust path 66B is relatively large. By providing a portion where the conductance is high in the exhaust path 66, the conductance of the gas in the entire exhaust path 66 increases.

Since the lower exhaust path 66A is formed at the circular portion 54, the flow path area (cross-sectional area in the flow path direction) thereof is restricted by the size of the circular portion 54. Since the diffusion space 55 is disposed at the same height as the circular portion 54, the lower exhaust path 66A is restricted by the size of the diffusion space 55. However, the upper exhaust path 66B is formed above of the circular portion 54, so that the flow path area can be increased without interfering with the diffusion space 55. In other words, the lower exhaust path 66A and the upper exhaust path 66B are configured so that a high conductance can be obtained for the exhaust path 66 while ensuring a large diffusion space 55 and obtaining sufficient gas diffusivity.

The film forming apparatus 1 includes a controller 10 configured by a computer (see FIG. 1), and the controller 10 includes a program. In this program, instructions (steps) are incorporated so that control signals can be sent from the controller 10 to each component of the film forming apparatus 1 and a film forming process described later can be performed. Specifically, the supply of each gas from the gas supply source 74, a pressure in the processing container 11 by the pressure control mechanism 17, a temperature of the wafer W by the heater 22, and the like are controlled by the program. The program is stored in a storage medium such as a compact disk, a hard disk, a memory card, or a DVD, and is installed in the controller 10.

The operation of the film forming apparatus 1 will be described. The wafer W is transferred into the processing container 11 by the transfer mechanism and is placed on the stage 21 at the lowered position by the pins 18. When the transfer mechanism retreats from the processing container 11, the gate valve 12 is closed and the stage 21 moves to the raised position. The wafer W on the stage 21 is heated by the heater 22 to a preset temperature. On the other hand, an atmosphere in the processing container 11 becomes a vacuum atmosphere with a predetermined pressure by the exhaust from the exhaust holes 52.

$TiCl_4$ gas is supplied from the gas supply source 74 to the shower head 3 and is discharged from the discharge holes 51 through the diffusion space 55. The $TiCl_4$ gas discharged from the discharge holes 51 as described above is supplied to the wafer W. Then, the $TiCl_4$ gas heads toward the exhaust hole forming region 53 near the discharge holes 51 from which the $TiCl_4$ gas is discharged, flows through the exhaust holes 52 and the exhaust space 83 in that order, and is removed. In other words, the $TiCl_4$ gas flows from each discharge hole 51A arranged on the virtual circle surrounding the exhaust hole forming region 53 toward the exhaust hole forming region 53. Accordingly, for one exhaust hole forming region 53, a gas flow flowing from each portion in the circumferential direction toward the exhaust hole forming region 53 with high uniformity is formed.

Figure 11:
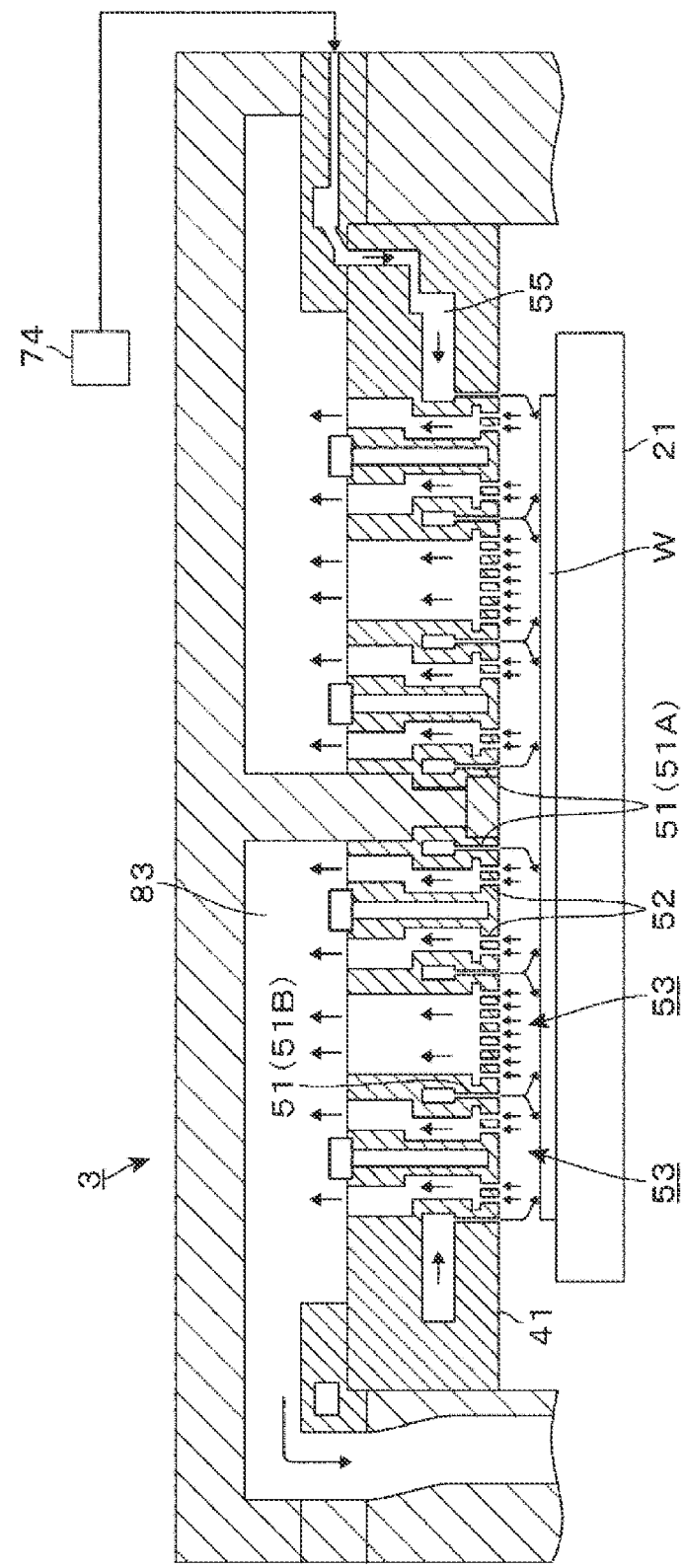
FIG. 11 illustrates gas flow in the film forming apparatus.

Since multiple sets of the exhaust hole forming region 53 and the discharge holes 51A surrounding the exhaust hole forming region 53 are formed on the facing surface 41 of the shower head 3, in each in-plane portion of the wafer W, the $TiCl_4$ gas uniformly flows from the discharge holes toward the exhaust hole forming region 53 surrounded by the exhaust holes. Further, the $TiCl_4$ gas flows from the discharge holes 51B formed between adjacent exhaust hole forming regions 53 to the adjacent exhaust hole forming regions 53, so that the flow rate of the gas in each in-plane portion of the wafer W becomes more uniform. Since the gas flow is formed from the discharge holes 51A and 51B toward the exhaust hole forming regions 53 in this way, the amount of the $TiCl_4$ gas adsorbed in each in-plane portion of the wafer W is uniform. FIG. 11 shows the flow of the $TiCl_4$ gas by arrows, and the configuration of the shower head 3 is simplified as compared with each of the above-described drawings in order to prevent the drawing from being complicated.

Then, the supply of the $TiCl_4$ gas from the gas supply source 74 to the shower head 3 is stopped, $N_2$ gas as a purge gas is supplied from the gas supply source 74 and is discharged from the discharge holes 51. The $N_2$ gas also flows on the wafer W, similarly to the $TiCl_4$ gas, to purge the excessive $TiCl_4$ gas remaining in the processing container 11 through the exhaust holes 52. Since multiple exhaust holes 52 open in the exhaust hole forming region 53, the purging, i.e., the exhaust of the $TiCl_4$ gas, is efficiently performed, and the $TiCl_4$ gas is quickly removed from the processing container 11.

Next, $NH_3$ gas is supplied from the gas supply source 74 to the shower head 3 and is discharged from the discharge holes 51. The $NH_3$ gas also flows in the same manner as the $TiCl_4$ gas and is uniformly supplied to each in-plane portion of the wafer W, and a thin layer of TiN is formed with high uniformity on the surface of the wafer W. Then, the supply of $NH_3$ gas from the gas supply source 74 to the shower head 3 is stopped, and the $N_2$ gas as a purge gas is supplied from the gas supply source 74 and is discharged from the discharge holes 51. The $N_2$ gas purges the $NH_4$ gas in the processing container 11 through the exhaust holes 52. Similarly to the purging of the $TiCl_4$ gas, the purging of the $NH_3$ gas is completed quickly. Then, a cycle of supplying the $TiCl_4$ gas to the wafer W, purging, supplying the $NH_3$ gas, and purging is repeated. The cycle is stopped when the thin layers of TiN are laminated to form a TiN film having a desired thickness. The wafer W is unloaded from the processing container 11 in the reverse order of the loading operation of the wafer W.

In the film forming apparatus 1 in which the processing container 11 includes the shower head 3, the $TiCl_4$ gas and the $NH_3$ gas as film forming gases can be uniformly supplied to each in-plane portion of the wafer W. Accordingly, the TiN film can be formed to have a uniform film thickness in each in-plane portion of the wafer W. Further, since the shower head 3 has high exhaust performance, the purging can be completed quickly as described above, so that the film forming apparatus 1 can provide a high throughput.

As described above, in the shower head 3, the diffusion space 55 and the exhaust paths 64 and 66 are partitioned by the circular portion 54 that is a cylindrical body formed for each exhaust hole forming region 53. In other words, the exhaust paths 64 and 66 and the diffusion space 55 are partitioned by the circular portion 54 serving as a partitioning portion for each exhaust hole forming region 53. If the partitioning portion is disposed in the diffusion space 55 so that an exhaust path common to the plurality of exhaust hole forming regions 53 is formed, the diffusion space 55 becomes narrow. However, it is possible to prevent the diffusion space 55 from becoming narrow by providing the partitioning portion for each exhaust hole forming region 53 as described above. Therefore, the conductance of the diffusion space 55 becomes high. Accordingly, the gas is uniformly discharged from each discharge hole 51, which makes it possible to further improve the uniformity of processing on the plane of the wafer W.

Further, by inserting the bolt 46 into the circular portion 54 that partitions the diffusion space 55 and the exhaust path 66 in this way, sufficient strength can be ensured at each portion of the main body portion 4 of the shower head 3, and it is unnecessary to separately provide a member that surrounds and protects the side circumference of the bolt 46. Since such a member is not required, the number of components constituting the main body portion 4 can be reduced, which is preferable.

Further, as described above, in the exhaust path corresponding to the exhaust hole forming region 53B, the downstream side whose height position is deviated from the diffusion space 55 is expanded in diameter to form the upper exhaust path 66B, and the conductance of the exhaust path 66 is increased so as not to affect the size of the diffusion space 55. Therefore, by providing the bolts 46 as described above while increasing the conductance in the diffusion space 55, a sufficient exhaust amount can be secured even in the exhaust hole forming region 53B where the number of exhaust holes 52 is small. By obtaining such a sufficient exhaust amount, the variation in the exhaust amount can be suppressed between the exhaust hole forming regions 53A and 53B can be suppressed, and the uniformity of processing on the plane of the wafer W can be further improved. Further, although four exhaust paths 66 are provided for one exhaust hole forming region 53B, the number of the exhaust paths is not limited to four, and may be three or five or more, for example.

Further, in the exhaust paths 64 and 66, the diameter-expanded portions 65 and 67 are formed at positions closer to the facing surface 41 below the diffusion space 55, respectively. By providing the diameter-expanded portions 65 and 67 in this way, the number of exhaust holes 52 connected to each of the exhaust paths 64 and 66 can be increased, and higher exhaust performance can be obtained, which is preferable.

Second Embodiment

Figure 12:
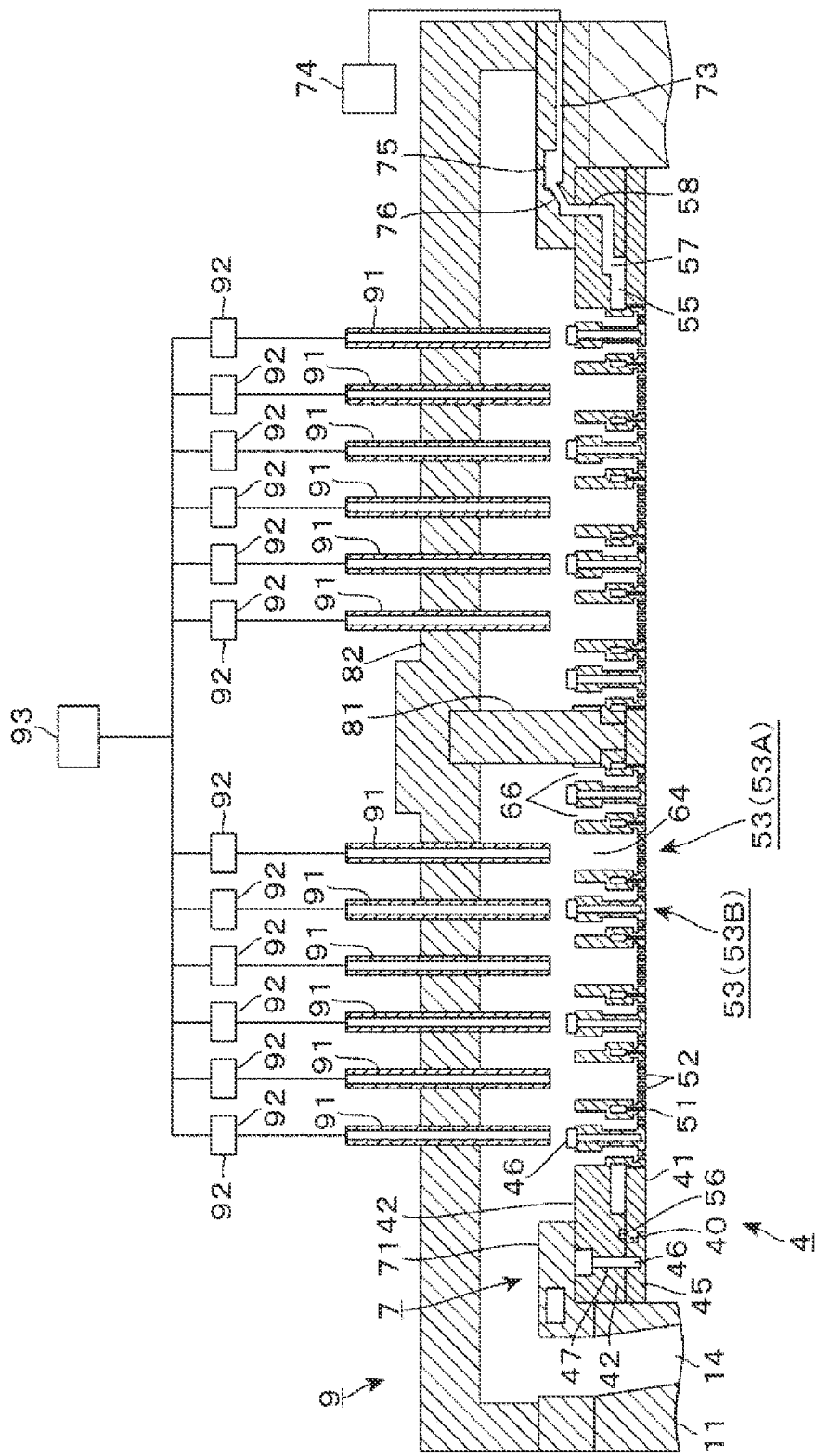
FIG. 12 is a vertical sectional side view of a shower head according to a second embodiment.
Figure 13:
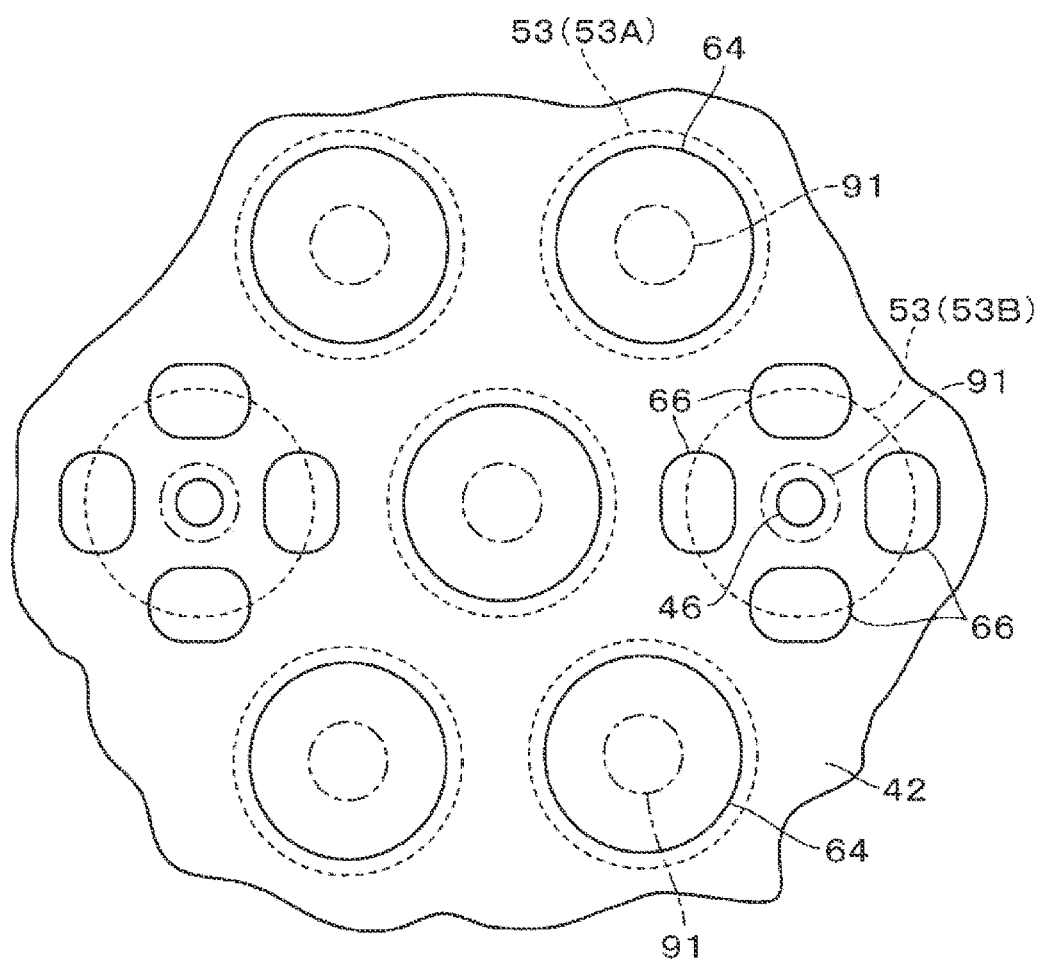
FIG. 13 is a plan view showing a relationship between gas inlet ports and exhaust holes of the shower head.

The differences between a shower head 9 according to a second embodiment and the shower head 3 will be described with reference to the vertical sectional side view of FIG. 12. The shower head 9 is applied to the film forming apparatus 1, instead of the shower head 3. At the lid portion 8 of the shower head 9, multiple gas inlet lines 91 penetrating the upper plate 82 of the lid portion 8 are provided, and each gas inlet line 91 opens downward away from the exhaust space forming surface 42 of the main body portion 4. The upstream sides of the gas inlet lines 91 are connected to a gas supply source 93 for supplying $N_2$ gas via flow rate controllers 92 including mass flow controllers, for example. The flow rate controllers 92 control the flow rate of the $N_2$ gas supplied to the downstream sides of the gas inlet lines 91. Therefore, the $N_2$ gas can be discharged from each gas inlet line 91 at a flow rate independent of each other, FIG. 13 is a plan view showing an example of opening positions of the gas inlet lines 91. In this example, the gas inlet lines 91 are provided for each exhaust hole forming region 53 to correspond to each exhaust hole forming region 53, and respectively open on the central portion of the exhaust hole forming region 53. The $N_2$ gas discharged from the gas inlet lines 91 are supplied to the exhaust paths 64 and 66. In the example shown in FIG. 13, the $N_2$ gas is supplied to the exhaust path 64 toward the opening. The $N_2$ gas is supplied to the exhaust path 66 toward the bolt 46, and the supplies $N_2$ gas flows radially on the exhaust space forming surface 42 in the plane direction. By supplying the $N_2$ gas in this way, the exhaust conductances of the exhaust paths 64 and 66 decrease depending on the flow rate of the $N_2$ gas supplied from the Corresponding gas inlet lines 91. Therefore, the exhaust amount in the exhaust hole forming region 53 corresponding to the gas inlet lines 91 is adjusted depending on the flow rate of the $N_2$ gas. The gas inlet lines 91 constitute a gas supply for adjusting conductance.

In a state where the $N_2$ gas is discharged from each gas inlet line 91 at a preset flow rate so that the uniformity of processing in the plane of the wafer W becomes higher, each gas is discharged from the discharge holes 51 and exhausted from the exhaust holes 52 as described above to process the wafer W. Since the $N_2$ gas discharged from each gas inlet line 91 in this way is a gas for adjusting the conductances of the exhaust paths 64 and 66, the flow rate thereof is adjusted so as not to be discharged from the exhaust holes 52 toward the wafer W. As long as the conductance can be adjusted in this way, the gas for adjusting is not limited to $N_2$ gas, and another gas such as Ar gas or the like may be used.

The gas inlet line 91 is not limited to be provided for each exhaust hole forming region 53, and one gas inlet line 91 may be provided for each of the plurality of exhaust hole forming regions 53. It is preferable to provide a plurality of the gas inlet lines 91 for the purpose of adjusting the exhaust amount of each in-plane portion of the wafer W to improve the uniformity of processing, but only one gas inlet line 91 may be provided in order to suppress the exhaust amount from the local exhaust hole forming region 53.

A cleaning gas may be supplied to each of the gas supply source 74 for supplying a gas to the main body portion 4 of the shower head 3 and the gas supply source 93 for suppling a gas to the gas inlet line 91. The cleaning gas can remove a TiN film, and is a fluorine-containing gas such as $ClF_3$ or the like, for example. When the wafer W is not processed, the cleaning gas is supplied from the gas supply source 74 to the main body portion 4 and from the gas supply source 93 to the gas inlet lines 91. The cleaning gas discharged from the shower head 3 flows similarly to the $TiCl_4$ gas described with reference to FIG. 11 and is exhausted toward the exhaust space 83, and the cleaning gas discharged from the gas inlet lines 91 flows through the exhaust space 83 similarly to the $N_2$ gas discharged from the gas inlet lines 91 and is exhausted. The cleaning gas removes the TiN film formed on the wall surface of the processing container 11 and the wall surface forming the exhaust space 83.

Third Embodiment

Figure 14:
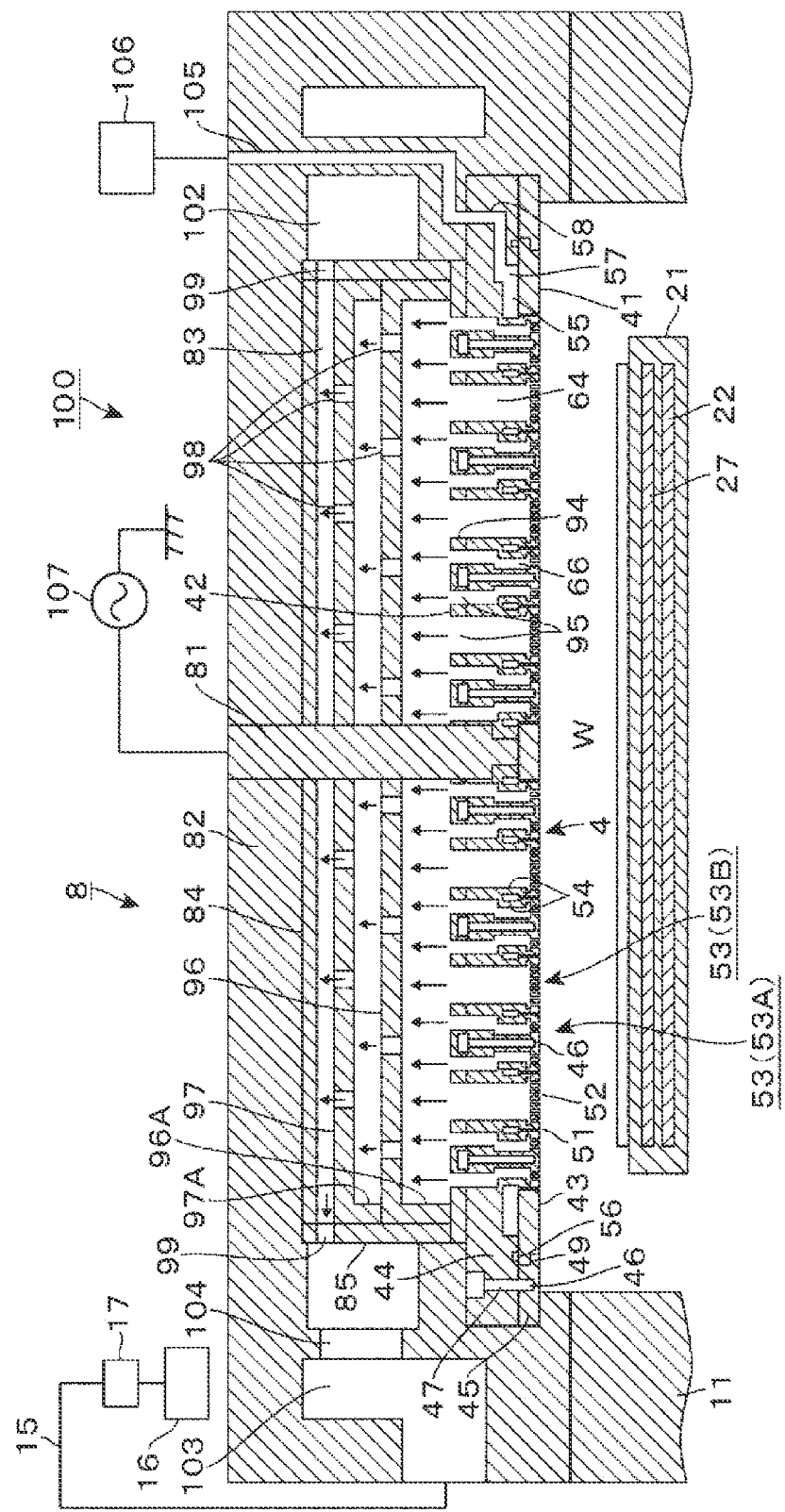
FIG. 14 is a vertical sectional side view showing a shower head according to a third embodiment.

Next, a shower head 100 according to a third embodiment will be described with reference to the vertical sectional side view of FIG. 14. The shower head 100 is applied to a plasma film forming apparatus as a substrate processing apparatus. The differences between the plasma film forming apparatus and the film forming apparatus 1 will be mainly described. This plasma film forming apparatus forms an $SiO_2$ (silicon oxide) film on a wafer W by supplying an Si-containing gas such as hexachlorodisilane or the like and an oxygen gas into a processing container and performing ALD, The oxygen gas is turned into plasma and supplied to the wafer W.

An electrode 27 for plasma formation is embedded in the stage 21. The shower head 100 includes the main body portion 4, similarly to the shower head 3. The main body portion 4 also serves as an electrode for plasma formation. When a oxygen gas is supplied into the processing container 11, a high-frequency power is applied to the main body portion 4, and capacitively coupled plasma is produced between the main body portion 4 and the stage 21.

In the shower head 100, a circular protective plate 94 is disposed to cover the upper surface of the second circular plate 44 and the head of the bolt 46, and the upper surface of the protective plate 94 defines the exhaust space forming surface 42. Through-holes 95 are formed in the protective plate 94 to overlap the exhaust paths 64 and 66. A partition plate 96, a partition plate 97, and a plate 84 are provided horizontally at intervals from the bottom in this order between the bottom surface of the lid portion 8 and the protective plate 94. The plate 84 is disposed directly below the bottom surface of the lid portion 8. The partition plates 96 and 97 divide the exhaust space 83 between the plate 84 and the protective plate 94 into three spaces in the vertical direction. The peripheral portions of the partition plates 96 and 97 project downward to form support cylindrical portions 96A and 97A, respectively. The support cylindrical portion 96A is supported on the peripheral portion of the protective plate 94, and the support cylindrical portion 97A is supported on the peripheral end portion of the partition plate 96. The support column 81 penetrates through the lid portion 8, the plate 84, and the partition plates 96 and 97.

The plate 84, the support cylindrical portions 96A and 97A, the surface of the support column 81, the protective plate 94 and the partition plates 96 and 97 are made of a dielectric such as quartz or the like. Since each part facing the exhaust space 83 is made of a dielectric, ions constituting a gas that has flowed into the exhaust space 83 after being turned into plasma between the main body portion 4 and the stage 21 are trapped. Accordingly, the wall surface forming the exhaust path on the downstream side of the exhaust space 83 is prevented from being damaged by ions. A plurality of through-holes 98 are formed in each of the partition plates 96 and 97. The through-holes 98 in the partition plate 96 are disposed so as not to overlap the through-holes 95 in the protective plate 94, and the through-holes 98 in the partition plate 97 are disposed so as not to overlap the through-holes 98 in the partition plate 96. The gas flows upward in the exhaust space 83, and the ions are reliably trapped by providing the through-holes 98 in this way. Further, an upright cylindrical portion 85 surrounding the plate 84 and the partition plates 96 and 97 is disposed between the bottom surface of the lid portion 8 and the protective plate 94, and the plate 84 is supported by the cylindrical portion 85. The cylindrical portion 85 is made of an insulator, and the inner peripheral surface thereof is covered with the supporting cylindrical portions 96A and 97A and prevented from being damaged by ions. On the sidewall of the cylindrical portion 85, a communication path 99 penetrating through the sidewall is formed at a height between the partition plate 97 and the plate 84.

The shower head 100 does not include the gas distribution plate 7, and the side peripheral wall of the lid portion 8 is formed so as to project onto the peripheral portion of the shower head 100. At the side peripheral wall projecting in this depression way, toward the outer a periphery is formed. The depression surrounds the exhaust space 83 and is formed as an inner annular space 102 partitioned from the exhaust space 83 by the cylindrical portion 85, and the inner annular space 102 communicates with the exhaust space 83 through the communication path 99. The lid portion 8 is provided with an outer annular space 103 surrounding the inner annular space 102 and a connection path 104 that connects the outer annular space 103 and the inner annular space 102. The upstream end of the exhaust line 15 is connected to the outer annular space 103. Therefore, the vacuum pump 16 can exhaust the exhaust space 83 through the outer annular space 103 and the inner annular space 102.

In the lid portion 8, a gas inlet line 105 is provided so as to extend vertically between the inner annular space 102 and the outer annular space 103, and the downstream end of the gas inlet line 105 is connected to the upstream end of the gas inlet line 58 of the main body portion 4. The upstream end of the gas inlet line 105 opens on the upper surface of the lid portion 8 and is connected to the gas supply source 106. An Si-containing gas, an oxygen gas, and an $N_2$ gas as a purge gas are supplied from the gas supply source 106. The inside of the support column 81 serves as a conductive path for supplying high-frequency power to the main body portion 4, and the upper end of the support column 81 penetrates the lid-portion 8 and is connected to a high-frequency power supply 107.

In the plasma forming apparatus, a cycle in which an Si-containing gas, an $N_2$ gas (purge gas), an oxygen gas, and an $N_2$ gas (purge gas) are sequentially discharged to the wafer W is repeatedly performed. In parallel with the discharge of the oxygen gas from the shower head 100, the high-frequency power is supplied from the high-frequency power supply 107 to the shower head 100, so that the oxygen gas is converted into plasma and supplied to the wafer W. The Si-containing gas and the oxygen gas converted into plasma in this plasma film forming apparatus 90 are also supplied to the wafer W with high uniformity in the same manner as each gas in the film forming apparatus 1, and, as a result, an $SiO_2$ film is formed in the plane of the wafer W with a uniform film thickness. Further, since the shower head 100 has a high exhaust performance similarly to the shower head 3, the Si-containing gas and the oxygen gas can be quickly exhausted, so that a high throughput can be obtained.

Fourth Embodiment

Figure 15:
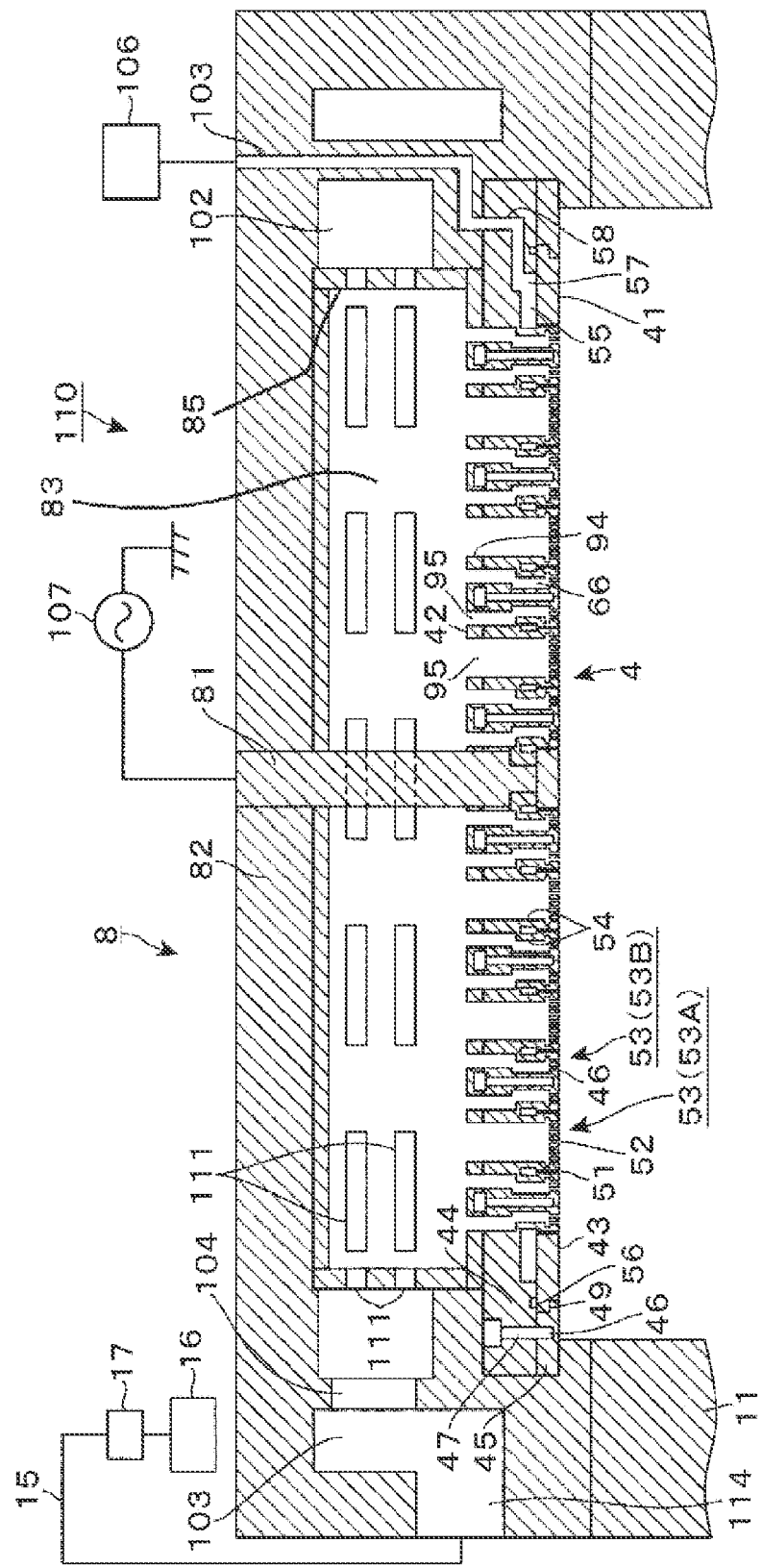
FIG. 15 is a vertical sectional side view showing a shower head according to a fourth embodiment.

The differences between a shower head 110 according to a fourth embodiment and the shower head 100 will be mainly described with reference to the vertical sectional side view of FIG. 15. Similarly to the shower head 100, the shower head 110 is applied to a plasma film forming apparatus for forming an $SiO_2$ film on a wafer W. In the exhaust space 83 of the shower head 110, the partition plates 96 and 97 and the support cylindrical portions 96A and 97A are not provided. On the sidewall of the cylindrical portion 85, slits 111 open at two different heights at intervals in the circumferential direction of the cylindrical portion 85. The exhaust space 83 and the inner annular space 102 communicate with each other through the slits 111. The shower head 110 is configured so that higher exhaust performance can be obtained by performing exhaust from a large number of the slits 111 without providing the partition plates 96 and 97 in the exhaust space 83.

In the above-described first to fourth embodiments, an example in which the shower head are applied to the film forming apparatus as a substrate processing apparatus has been described. However, the shower head described in each embodiment is not necessarily applied to the film forming apparatus. For example, the shower head may be applied to an etching apparatus for performing dry etching. Therefore, the gas supply sources 74 and 106 can be configured to supply an etching gas for etching the surface of the wafer W as the processing gas, instead of the film forming gas.

By applying the shower head of each embodiment to the etching apparatus, the etching gas can be uniformly supplied to each part in the plane of the wafer W, and the etching can be uniformly performed in the plane of the wafer W. Further, since the shower head of each embodiment has high exhaust performance as described above, the pressure in the processing container 11 can be set to a relatively low pressure. When the pressure in the processing container 11 is low, the etching gas is vigorously introduced from the shower head into the processing space between the stage 21 and the shower head and collides with the wafer W, so that etching rate can be increased. Accordingly, the throughput of the etching apparatus to which the shower head is applied can be increased.

Figure 16:
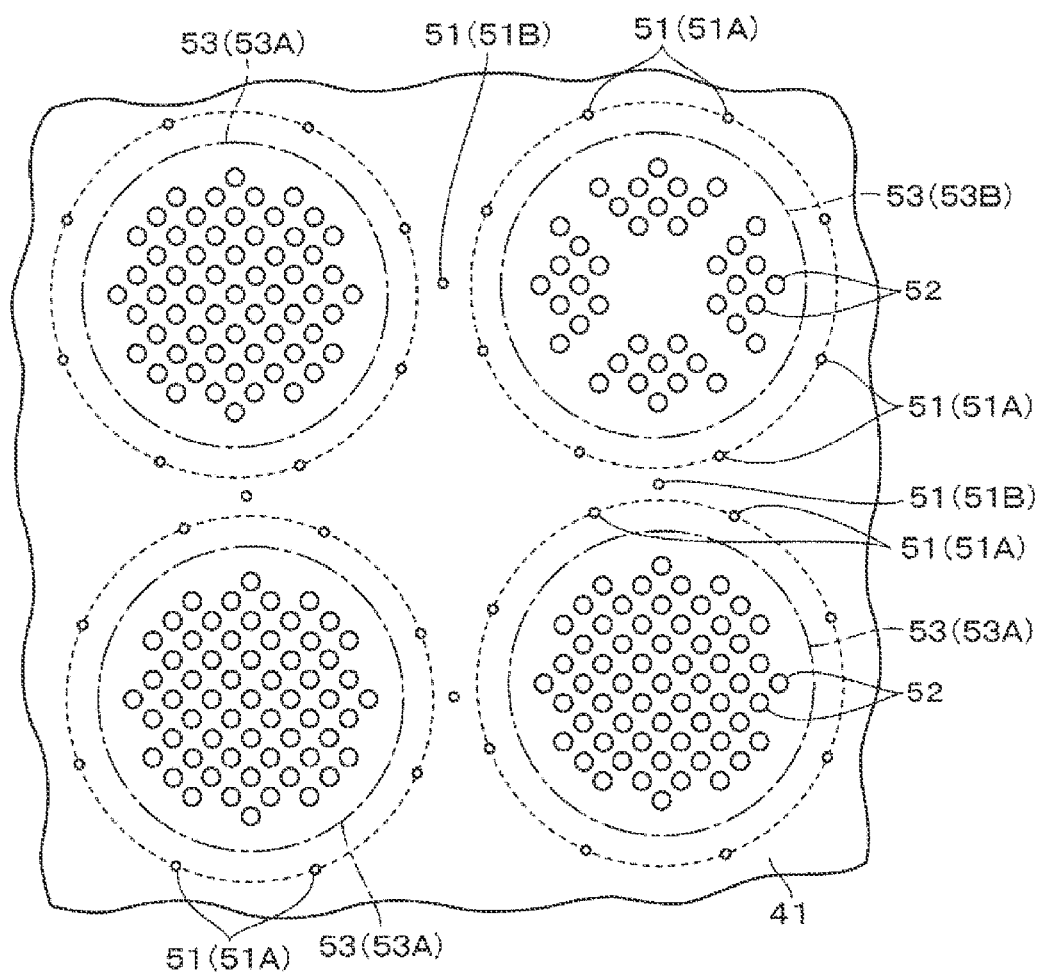
FIG. 16 is a plan view showing a layout of discharge holes and exhaust holes in the shower head.

The exhaust hole forming regions 53 are not necessary arranged in a staggered manner, and may be arranged in a matrix shape as shown in FIG. 16, for example. Since the discharge holes 51B described in FIG. 6 are disposed between the adjacent exhaust hole forming regions 53 as described above, they correspond to the layout of the exhaust hole forming regions 53. Therefore, the discharge holes 51B are not necessarily arranged along the circle as shown in FIG. 6. However, in order to provide more sets of the exhaust hole forming region 53 and the discharging holes 51A surrounding the exhaust hole forming region 53 on the facing surface 41 of the shower head, it is preferable that the exhaust hole forming regions 53 are arranged in a staggered manner as described in the first embodiment.

In the example described in the first embodiment, six discharge holes 51A surround one exhaust hole forming region 53. However, the number of discharge holes 51A is not limited to six. FIG. 16 shows an example in which the exhaust hole forming region 53 is surrounded by eight discharge holes 51A. Also in FIG. 16, the discharge holes 51A are arranged along a circle, and the circle is indicated by virtual dotted lines. Each circle is not in contact with each other. In other words, there is no common discharge hole 51A between the discharge hole 51A group surrounding the exhaust hole forming region 53 and the discharge hole 51A group surrounding the exhaust hole forming region 53 adjacent thereto. Although it is not necessary to provide the common discharge hole 51A, by adopting the layout in which the common discharge hole 51A exists as described above, more sets of the exhaust hole forming region 53 and the discharge hole 51A group surrounding the exhaust hole forming region 53 can be disposed on the facing surface 41. Therefore, it is preferable to use the layout in which the common discharge hole 51A exists. Further, the discharge holes 51A are not necessarily arranged along a circle, and may be arranged along a polygon surrounding the exhaust hole forming region 53, that is, at the apices of the polygon. However, by arranging the discharge holes 51A along the circle, the distances from the exhaust hole forming region 53 to each of the discharge holes 51A can be uniform, and the wafer W can be more reliably processed with high uniformity, which is preferable.

The substrate to be processed by each shower head is not limited to the wafer W, and may be a substrate for manufacturing a flat panel display, for example. Hence, the substrate does not necessarily have a circular shape, but may have a square shape. Further, when the shower head is applied to the plasma processing apparatus, the high-frequency power is not limited to being supplied to the shower head so as to produce a capacitively coupled plasma, and the high-frequency power may be supplied to the shower head so as to produce an inductively coupled plasma. The above-described embodiments are considered to be illustrative in all respects and not restrictive. The above-described embodiments may be omitted, replaced, modified and combined in various forms without departing from the scope of the appended claims and the gist thereof.

(Evaluation Tests)

The evaluation tests conducted in relation with the technique of the present disclosure will be described. In the evaluation tests, the exhaust holes were arranged in different manners in the processing container, and a pressure in the processing container was measured in the case of changing the flow rate of Ar gas supplied to each processing container within a range of 100 sccm to 2000 sccm. In an evaluation test 1-1, 6300 exhaust holes were arranged in a staggered manner at the ceiling portion of the processing container, and the exhaust was performed. The exhaust holes have a hole diameter of 1.2 mm. In an evaluation test 1-2, the exhaust holes having a hole diameter of 1.2 mm were arranged at the ceiling portion of the processing container and the exhaust was performed, as in the evaluation test 1-1, but the number of the exhaust holes was 12128. In an evaluation test 1-3, the exhaust holes were arranged in the layout described in the first embodiment and the exhaust was performed. The exhaust holes have a hole diameter of 1.2 mm, and the number of exhaust holes was 16448. In each evaluation test, the total area of the exhaust path to which each exhaust hole is connected is the same as the flow path area of the line having a line diameter of 150 mm. The length of the exhaust path was set to 500 mm, and the exhaust pressure was set to about 1 mTorr.

Figure 17:
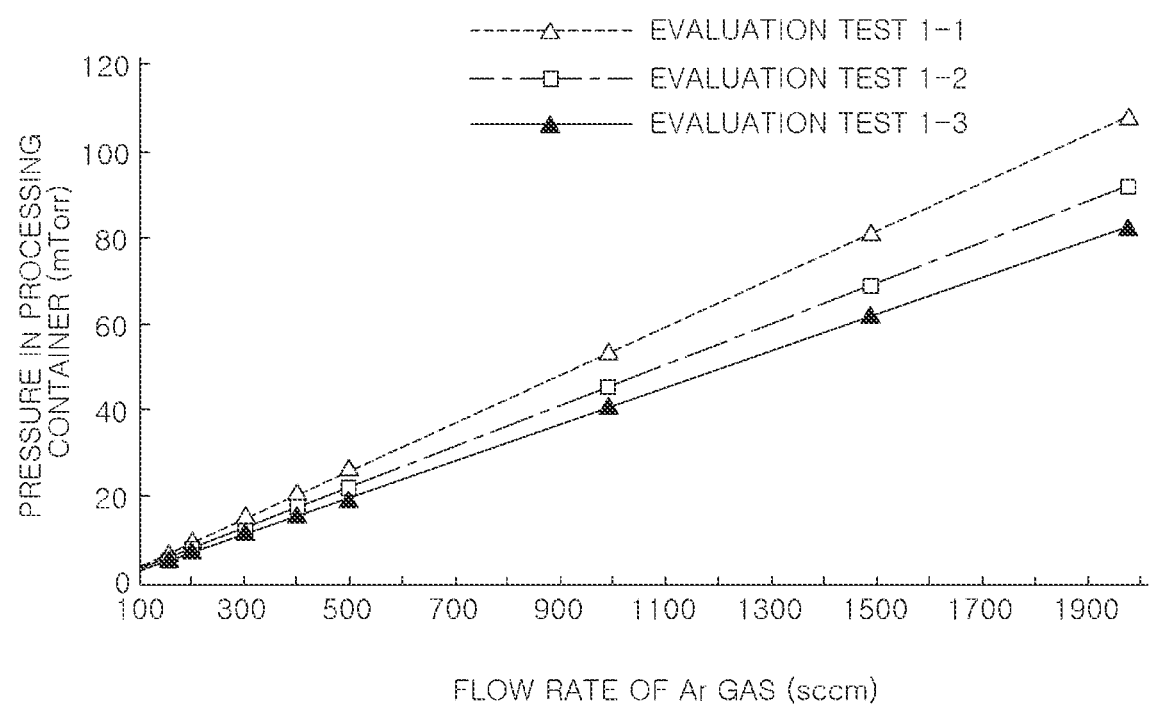
FIG. 17 is a graph showing results of evaluation tests.

The graph of FIG. 17 shows the results of the evaluation tests. In the graph, the horizontal axis represents the flow rate of Ar gas supplied into the processing container, and the vertical axis represents the pressure (unit: mTorr) in the processing container. As shown in the graph, when the flow rate of Ar gas is the same, the pressure in the processing container was higher in the order of the evaluation test 1-1, the evaluation test 1-2, and the evaluation test 1-3. Therefore, it was clear that the configuration of the evaluation test 1-3 has the highest exhaust performance, and the high exhaust performance is obtained by the layout of the exhaust holes 52 described in the first embodiment.

DESCRIPTION OF REFERENCE NUMERALS

3: shower head
4: main body portion
41: facing surface
42: exhaust space forming surface
51: discharge hole
52: exhaust hole
53: exhaust hole forming region
55: diffusion space
64, 66: exhaust path
8: lid portion

The invention claimed is:

1. A shower head disposed in a processing container where a substrate is accommodated and configured to discharge a gas to the substrate in a shower pattern, comprising:
  a main body portion having a facing surface facing a stage disposed in the processing container to place the substrate thereon;
  a covering section that covers a surface formed on an opposite side of the facing surface of the main body portion, and forms, between the surface and the covering section, an exhaust space that is exhausted by an exhaust mechanism;
  a plurality of exhaust hole forming regions disposed on the facing surface apart from each other and each having a plurality of exhaust holes;
  a plurality of discharge holes disposed for each of the exhaust hole forming regions on the facing surface to surround each of the plurality of exhaust hole forming regions and configured to discharge the gas;
  a diffusion space disposed to be shared by the plurality of discharge holes, where the gas supplied to the main body portion is diffused to be supplied to each of the plurality of discharge holes;
  an exhaust path disposed in the main body portion to be connected to the exhaust holes and opened to the exhaust space in order to exhaust the gas discharged from the discharge holes into the exhaust space; and
  a plurality of cylindrical portions that partition the diffusion space and the exhaust path in a horizontal direction, each cylindrical portion surrounding a corresponding one of the plurality of exhaust hole forming regions.

2. The shower head of claim 1, wherein the plurality of discharge holes are provided along a circle surrounding the exhaust hole forming region for each of the exhaust hole forming regions, wherein the sizes of the circles for each of the exhaust hole forming regions are identical.

3. The shower head of claim 2, wherein a group of the discharge holes surrounding a first exhaust hole forming region of the exhaust hole forming regions adjacent to each other is a first discharge hole group and a group of the discharge holes surrounding a second exhaust hole forming region of the exhaust hole forming regions adjacent to each other is a second discharge hole group,
  the discharge hole is disposed between the first exhaust hole forming region and the second exhaust hole forming region, in addition to the first discharge hole group and the second discharge hole group arranged along the circle respectively.

4. The shower head of claim 3, further comprising a discharge hole common to the first discharge hole group and the second discharge hole group.

5. The shower head of claim 1, wherein the exhaust hole forming regions form lines in each of a vertical direction and a horizontal direction in plan view, and
the exhaust hole forming regions in lines adjacent to each other in the vertical direction and the exhaust hole forming regions in lines adjacent to each other in the horizontal direction are arranged in a staggered manner.

6. The shower head of claim 1, wherein the exhaust path is widened in width at a position closer to the facing surface than the diffusion space.

7. The shower head of claim 1, wherein the main body portion includes:
a first member having the facing surface;
a second member having a surface formed on an opposite side of the facing surface and overlapping the first member; and
a coupling member configured to couple the first member and the second member,
wherein the coupling member is disposed to overlap one of the plurality of exhaust hole forming regions, and
a layout of the exhaust holes in said one exhaust hole forming region and a layout of the exhaust holes in another exhaust hole forming region among the plurality of exhaust hole forming regions are different.

8. The shower head of claim 7, wherein a plurality of the exhaust paths are provided for said one exhaust hole forming region, and the plurality of the exhaust paths are disposed to surround the coupling member.

9. The shower head of claim 7, wherein the exhaust path connected to the exhaust holes in said one exhaust hole forming region includes a downstream exhaust path positioned at the same height as the diffusion space and an upstream exhaust path positioned above the diffusion space, and
an area of the upstream exhaust path is larger than an area of the downstream exhaust path.

10. The shower head of claim 7, wherein the exhaust path connected to the exhaust holes of said another exhaust hole forming region has a diameter of 8 mm to 20 mm.

11. The shower head of claim 1, wherein the covering section is provided with a conductance adjusting gas supply configured to supply an adjusting gas for adjusting a conductance of the gas in each exhaust hole toward the surface formed on the opposite side of the facing surface.

12. The shower head of claim 11, wherein the conductance adjusting gas supply supplies the adjusting gas to different positions on the surface formed on the opposite side of the facing surface.

13. The shower head of claim 1, wherein the discharge holes have a hole diameter smaller than a hole diameter of the exhaust holes.

14. The shower head of claim 1, wherein the discharge holes have a hole diameter of 0.1 mm to 1.0 mm.

15. The shower head of claim 1, wherein the exhaust holes have a hole diameter of 0.5 mm to 2.5 mm.

16. A substrate processing apparatus comprising:
the shower head described in claim 1;
the processing container;
the stage;
the exhaust mechanism; and
a gas supply source configured to supply a processing gas for processing the substrate to the diffusion space.

* * * * *